(12) United States Patent
Petrov

(10) Patent No.: US 9,008,151 B2
(45) Date of Patent: Apr. 14, 2015

(54) TRANSMISSION METHOD, TRANSMITTER, RECEPTION METHOD, AND RECEIVER

(71) Applicant: Panasonic Corporation, Osaka (JP)

(72) Inventor: Mihail Petrov, Langen (DE)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/006,807

(22) PCT Filed: Jan. 16, 2013

(86) PCT No.: PCT/JP2013/000160
§ 371 (c)(1),
(2) Date: Sep. 23, 2013

(87) PCT Pub. No.: WO2013/108617
PCT Pub. Date: Jul. 25, 2013

(65) Prior Publication Data
US 2014/0056330 A1     Feb. 27, 2014

(30) Foreign Application Priority Data
Jan. 19, 2012   (EP) ..................................... 12151737

(51) Int. Cl.
*H04L 27/20* (2006.01)
*H04B 1/7143* (2011.01)

(52) U.S. Cl.
CPC .............. *H04B 1/7143* (2013.01); *H04L 27/20* (2013.01)

(58) Field of Classification Search
CPC ...................................................... H04L 27/20
USPC .......................... 375/135, 267, 347, 299, 260
See application file for complete search history.

(56) References Cited

U.S. PATENT DOCUMENTS

2006/0008031 A1 *   1/2006   Vummintala et al. .......... 375/299
2006/0034381 A1 *   2/2006   Ionescu et al. ................. 375/267

(Continued)

FOREIGN PATENT DOCUMENTS

EP    2 288 048 A1    2/2011

OTHER PUBLICATIONS

DVB Organization, "Digital Video Broadcasting (DVB); Next Generation Broadcasting system to handheld, physical layer specification (DVB-NGH)", DVB, Nov. 30, 2012, XP55055777, Retrieved from the Internet: URL:http://www.dvb.org/technology/standards/A160_DVB-NGH_Spec.pdf [retrieved on Mar. 7, 2013] * section 6 and in particular section 6.5 *.

(Continued)

*Primary Examiner* — Jaison Joseph
(74) *Attorney, Agent, or Firm* — Wenderoth, Lind & Ponack, L.L.P.

(57) ABSTRACT

Provided is a transmission method that converts an encoded block of data into first complex symbols each including a real component and an imaginary component, one or which is designated as a first component and the other as a second component; writes the first components and the second components of the first complex symbols respectively column by column into a first interleaver matrix and a second interleaver matrix having $N_R$ rows; applies a cyclic shift to each column of the second interleaver matrix in accordance with a predetermined shift pattern; and reads the first components from the first interleaver matrix and the second components from the cyclically shifted second interleaver matrix row by row. $N_R$ is a multiple of $N_{RF}$ greater than $N_{RF}$ ($N_{RF}$ being an integer greater than one), and the shift pattern for the cyclic shift includes only integers that are not a multiple of $N_{RF}$.

5 Claims, 27 Drawing Sheets

(56) References Cited

U.S. PATENT DOCUMENTS

2011/0131464 A1* 6/2011 Ko et al. ............. 714/752
2011/0280327 A1* 11/2011 Ko et al. ............. 375/260

OTHER PUBLICATIONS

Catherine Douillard et al., "The Bit Interleaved Coded Modulation Module for DVB-NGH: Enhanced features for mobile reception" Telecommunications (ICT), 2012 19th International Conference on, IEEE, Apr. 23, 2012, pp. 1-6, XP032188384, DOI: 10.1109/ICTEL.2012.6221327 ISBN: 978-1-4673-0745-1 * section V *.

DVB Organization, "Summary of the 43$^{rd}$ DVB-TM-H Meeting", TM-NGH1334_111205FH_Summary_Erlangen_Meeting.pdf , DVB Digital Video Broadcasting, C/O EBU—17A Ancienne Route—CH-1218 Grand Saconnex, Geneva—Switzerland, Dec. 8, 2011, XP017838374, paragraph [0007].

DVB Organization, "Performance Analysis of Time Frequency Slicing", DVB, Digital Video Broadcasting, C/O EBU—17A Ancienne Route—CH-1218 Grand Saconnex, Geneva—Switzerland, Jul. 13, 2011, XP017836618, * section III. B and C and section VI, first paragraph, last sentence *.

DVB-NGH Standardization Document TM-NGH1172:"Details of the Cell +Time Interleaving", Sep. 19, 2011.

ETSI EN 302.755, "Digital Video Broadcasting (DVB); Frame structure channel coding and modulation for a second-generation digital terrestrial television broadcasting system (DVB-T2)", v.1.2.1, Feb. 2011.

David Gozalvez et al., "Performance Evaluation of DVB-T2 Time Interleaving in Mobile Environments", Vehicular Technology Conference Fall (VTC Fall 2010), 2010 IEEE 72nd, IEEE, Piscataway, NJ, USA, Sep. 6, 2010, pp. 1-5, XP031770546, ISBN: 978-1-4244-3573-9 * p. 2, left-hand column, paragraph 2; figure 1 *.

Zhongren Cao et al., "Deterministic Multiuser Carrier-Frequency Offset Estimation for Interleaved OFDMA Uplink", IEEE Transactions on Communications, IEEE Service Center, Piscataway, NJ. USA, vol. 52, No. 9, Sep. 1, 2004, pp. 1585-1594, XP011119273, ISSN: 0090-6778, DOI:10.1109/TCOMM.2004.833183 * paragraph bridging p. 1585 and 1586 *.

Yuexing Peng et al., "Performance of Convolutional Turbo Coded High-speed Portable Internet (WiBro) System", IEEEVTS Vehicular Technology Conference. Proceedings, IEEE, US, Apr. 1, 2007, pp. 730-734, XP031092726, ISSN: 1550-2252 ISBN: 978-1-4244-0266-3 * p. 731, right-hand column, paragraph 1 *.

S. K. Hashemizadeh et al., "Sensitivity Analysis of Interleaved OFDMA System Uplink to Carrier Frequency Offset", Personal Indoor and Mobile Radio Communications (PIMRC), 2011 IEEE 22nd International Symposium on, IEEE, Sep. 11, 2011, pp. 1631-1635, XP032102181, DOI: 10.1109/PIMRC.2011.6139781 ISBN: 978-1-4577-1346-0 * p. 1631, right-hand column, paragraph 2 *.

Extended European Search Report issued May 2, 2012 in corresponding European Application No. 12151737.9.

International Search Report and Written Opinion of the International Searching Authority issued Jun. 4, 2013 in corresponding International Application No. PCT/JP2013/000160.

* cited by examiner

| 8D-RC | Real | 1 | 3 | 5 | 7 | 9 | 11 | 13 | 15 | 17 | 19 | 21 | 23 | 25 | 27 | 29 | 31 | 33 | 35 | 37 | 39 | 41 | 43 | 45 | 47 |
|---|---|---|---|---|---|---|---|---|---|---|---|---|---|---|---|---|---|---|---|---|---|---|---|---|---|
| | Imag | 2 | 4 | 6 | 8 | 10 | 12 | 14 | 16 | 18 | 20 | 22 | 24 | 26 | 28 | 30 | 32 | 34 | 36 | 38 | 40 | 42 | 44 | 46 | 48 |

|  | Slice of real component | | | |
|---|---|---|---|---|
|  | 1 | 2 | 3 | 4 |
| 1 | ✕ | 1 | 2 | 3 |
| 2 | 1 | ✕ | 1 | 2 |
| 3 | 2 | 1 | ✕ | 1 |
| 4 | 3 | 2 | 1 | ✕ |

Slice of imag component

|  |  |  |  |  |  |  | Shifts | | | | | |
|---|---|---|---|---|---|---|---|---|---|---|---|---|
|  |  |  |  |  |  |  | 2 | 2 | 2 | 2 | 2 | 2 |
| Section 1 | 1 | 5 | 9 | 13 | 17 | 21 | 3 | 7 | 11 | 15 | 19 | 23 |
| Section 2 | 2 | 6 | 10 | 14 | 18 | 22 | 4 | 8 | 12 | 16 | 20 | 24 |
| Section 3 | 3 | 7 | 11 | 15 | 19 | 23 | 1 | 5 | 9 | 13 | 17 | 21 |
| Section 4 | 4 | 8 | 12 | 16 | 20 | 24 | 2 | 6 | 10 | 14 | 18 | 22 |

Real / Imag

Fig. 21

| | | Shifts | | | | | | | |
|---|---|---|---|---|---|---|---|---|---|
| | 1 | 2 | 4 | 5 | 1 | 2 | 4 | 5 | |
| Row 1 (RF 1) | 6 | 11 | 15 | 20 | 30 | 35 | 39 | 44 | Imag |
| Row 2 (RF 2) | 1 | 12 | 16 | 21 | 25 | 36 | 40 | 45 | |
| Row 3 (RF 3) | 2 | 7 | 17 | 22 | 26 | 31 | 41 | 46 | |
| Row 4 (RF 1) | 3 | 8 | 13 | 23 | 27 | 32 | 42 | 47 | |
| Row 5 (RF 2) | 4 | 9 | 18 | 24 | 28 | 33 | 37 | 48 | |
| Row 6 (RF 3) | 5 | 10 | 14 | 19 | 29 | 34 | 38 | 43 | |
| Row 1 (RF 1) | 1 | 7 | 13 | 19 | 25 | 31 | 37 | 43 | Real |
| Row 2 (RF 2) | 2 | 8 | 14 | 20 | 26 | 32 | 38 | 44 | |
| Row 3 (RF 3) | 3 | 9 | 15 | 21 | 27 | 33 | 39 | 45 | |
| Row 4 (RF 1) | 4 | 10 | 16 | 22 | 28 | 34 | 40 | 46 | |
| Row 5 (RF 2) | 5 | 11 | 17 | 23 | 29 | 35 | 41 | 47 | |
| Row 6 (RF 3) | 6 | 12 | 18 | 24 | 30 | 36 | 42 | 48 | |

TFS cycle 1: Rows 1–3
TFS cycle 2: Rows 4–6

Fig. 22

| | | Shifts | | | | | | | |
|---|---|---|---|---|---|---|---|---|---|
| | | 2 | 4 | 2 | 4 | 2 | 4 | 2 | 4 |
| Row 1 (RF 1) | TFS cycle 1 | 1 | 7 | 13 | 19 | 25 | 31 | 37 | 43 |
| Row 2 (RF 2) | | 2 | 8 | 14 | 20 | 26 | 32 | 38 | 44 |
| Row 3 (RF 3) | | 3 | 9 | 15 | 21 | 27 | 33 | 39 | 45 |
| Row 4 (RF 1) | TFS cycle 2 | 4 | 10 | 16 | 22 | 28 | 34 | 40 | 46 |
| Row 5 (RF 2) | | 5 | 11 | 17 | 23 | 29 | 35 | 41 | 47 |
| Row 6 (RF 3) | | 6 | 12 | 18 | 24 | 30 | 36 | 42 | 48 |

Real

| | Shifts | | | | | | | |
|---|---|---|---|---|---|---|---|---|
| | 2 | 4 | 2 | 4 | 2 | 4 | 2 | 4 |
| | 5 | 9 | 17 | 21 | 29 | 33 | 41 | 45 |
| | 6 | 10 | 18 | 22 | 30 | 34 | 42 | 46 |
| | 1 | 11 | 13 | 23 | 25 | 35 | 37 | 47 |
| | 2 | 12 | 14 | 24 | 26 | 36 | 38 | 48 |
| | 3 | 7 | 15 | 19 | 27 | 31 | 39 | 43 |
| | 4 | 8 | 16 | 20 | 28 | 32 | 40 | 44 |

Imag

Fig. 23

|  |  | Shifts | | | | | |
|---|---|---|---|---|---|---|---|
|  |  | 2 | 3 | 5 | 3 | 5 | 6 |
| TFS cycle 1 | Row 1 (RF 1) | 7 | 14 | 20 | 30 | 36 | 43 |
|  | Row 2 (RF 2) | 8 | 15 | 21 | 31 | 37 | 44 |
|  | Row 3 (RF 3) | 1 | 16 | 22 | 32 | 38 | 45 |
|  | Row 4 (RF 4) | 2 | 9 | 23 | 25 | 39 | 46 |
| TFS cycle 2 | Row 5 (RF 1) | 3 | 10 | 24 | 26 | 40 | 47 |
|  | Row 6 (RF 2) | 4 | 11 | 17 | 27 | 33 | 48 |
|  | Row 7 (RF 3) | 5 | 12 | 18 | 28 | 34 | 41 |
|  | Row 8 (RF 4) | 6 | 13 | 19 | 29 | 35 | 42 |

Fig. 24

|  |  | Shifts | | | | | |
|---|---|---|---|---|---|---|---|
|  |  | 5 | 6 | 7 | 5 | 6 | 7 |
| TFS cycle 1 | Row 1 (RF 1) | 8 | 19 | 30 | 44 | 55 | 66 |
|  | Row 2 (RF 2) | 9 | 20 | 31 | 45 | 56 | 67 |
|  | Row 3 (RF 3) | 10 | 21 | 32 | 46 | 57 | 68 |
|  | Row 4 (RF 4) | 11 | 22 | 33 | 47 | 58 | 69 |
| TFS cycle 2 | Row 5 (RF 1) | 12 | 23 | 34 | 48 | 59 | 70 |
|  | Row 6 (RF 2) | 1 | 24 | 35 | 37 | 60 | 71 |
|  | Row 7 (RF 3) | 2 | 13 | 36 | 38 | 49 | 72 |
|  | Row 8 (RF 4) | 3 | 14 | 25 | 39 | 50 | 61 |
| TFS cycle 3 | Row 9 (RF 1) | 4 | 15 | 26 | 40 | 51 | 62 |
|  | Row 10 (RF 2) | 5 | 16 | 27 | 41 | 52 | 63 |
|  | Row 11 (RF 3) | 6 | 17 | 28 | 42 | 53 | 64 |
|  | Row 12 (RF 4) | 7 | 18 | 29 | 43 | 54 | 65 |

TRANSMISSION METHOD, TRANSMITTER, RECEPTION METHOD, AND RECEIVER

TECHNICAL FIELD

The present invention relates to digital communications.

BACKGROUND ART

In recent years, transmitters have been developed to transmit data while hopping between a plurality of RF channels (for example, see Non-Patent Literature 1).

Such transmitters convert forward-error-correction (FEC) codewords, based on an FEC code, into a plurality of complex symbols and allocate the real component and imaginary component of each complex symbol to one of the plurality of RF channels to achieve channel diversity.

CITATION LIST

Patent Literature

PTL 1: EP 2 288 048 A

Non Patent Literature

NPL 1: DVB-NGH Standardization Document TM-NGH1172: "Details of the Cell+Time Interleaving"
NPL 2: ETSI EN 302.755: "Frame structure channel coding and modulation for a second-generation digital terrestrial television broadcasting system" (DVB-T2 standard)

SUMMARY OF INVENTION

Technical Problem

However, channel diversity depends on the spread over RF channels of the real component and the imaginary component of each complex symbol.

It is an aim of the present invention to provide a transmission method for achieving excellent channel diversity by appropriately spreading the real component and the imaginary component of each complex signal over RF channels.

Solution to Problem

In order to achieve the above aim, one aspect of the present invention is a transmission method for transmitting digital data over a plurality of $N_{RF}$ frequency channels ($N_{RF}$ being an integer greater than one), the transmission method comprising the steps of: encoding a block of data of a predetermined length with an error correction code; converting the encoded block of data into a plurality of first complex symbols each including a real component and an imaginary component; with one of the real component and the imaginary component designated as a first component and the other designated as a second component, writing the first components of the first complex symbols column by column into a first interleaver matrix having $N_R$ rows and writing the second components of the first complex symbols column by column into a second interleaver matrix having $N_R$ rows; applying a cyclic shift to each column of the second interleaver matrix in accordance with a predetermined shift pattern; reading the first components from the first interleaver matrix row by row and the second components from the cyclically shifted second interleaver matrix row by row to generate a plurality of second complex symbols; and transmitting the second complex symbols over the frequency channels, each of the second complex symbols corresponding to one of the frequency channels, wherein $N_R$ is a multiple of $N_{RF}$ greater than $N_{RF}$, and the shift pattern for the cyclic shift includes only integers that are not a multiple of $N_{RF}$.

Advantageous Effects of Invention

The above transmission method achieves excellent channel diversity.

BRIEF DESCRIPTION OF DRAWINGS

FIG. 2A shows an example of mapping a real symbol to a complex symbol in the case of a 2D rotated constellation.
FIG. 2B shows an example of mapping a real symbol to a complex symbol in the case of a 4D rotated constellation.
FIG. 2C illustrates an example of mapping a real symbol to a complex symbol in the case of an 8D rotated constellation.
FIG. 7 illustrates an example of the component interleaver 140 in FIG. 1 applying cyclic shifts to the columns of the imaginary-component interleaver matrix.
FIG. 10 illustrates the distance between two components in a 2D rotated constellation block after component interleaving by the component interleaver 140 in FIG. 1 when $N_R=4$.
FIG. 11 illustrates an example of the component interleaver 140 in FIG. 1 applying cyclic shifts to the columns of the imaginary-component interleaver matrix when the number of RF channels is three and the number of TFS cycles is two.

FIG. 15 illustrates an example of the component interleaver 140A in FIG. 13 applying cyclic shifts to the columns of the imaginary-component interleaver matrix.

FIG. 18 illustrates another example of the component interleaver 140A in FIG. 13 applying cyclic shifts to the columns of the imaginary-component interleaver matrix.

FIG. 21 illustrates an example of the shift pattern for cyclic shifting by the component interleaver 140B in FIG. 20.

FIG. 22 illustrates another example of the shift pattern for cyclic shifting by the component interleaver 140B in FIG. 20.

FIG. 23 illustrates yet another example of the shift pattern for cyclic shifting by the component interleaver 140B in FIG. 20.

FIG. 24 illustrates yet another example of the shift pattern for cyclic shifting by the component interleaver 140B in FIG. 20.

DESCRIPTION OF EMBODIMENTS

Embodiments of the present invention are described below with reference to the drawings.

Examination and Discovery by the Inventor

First, typical transmission technology for transmission over a plurality of RF channels while hopping therebetween is described with reference to the figures.

Figure 1:
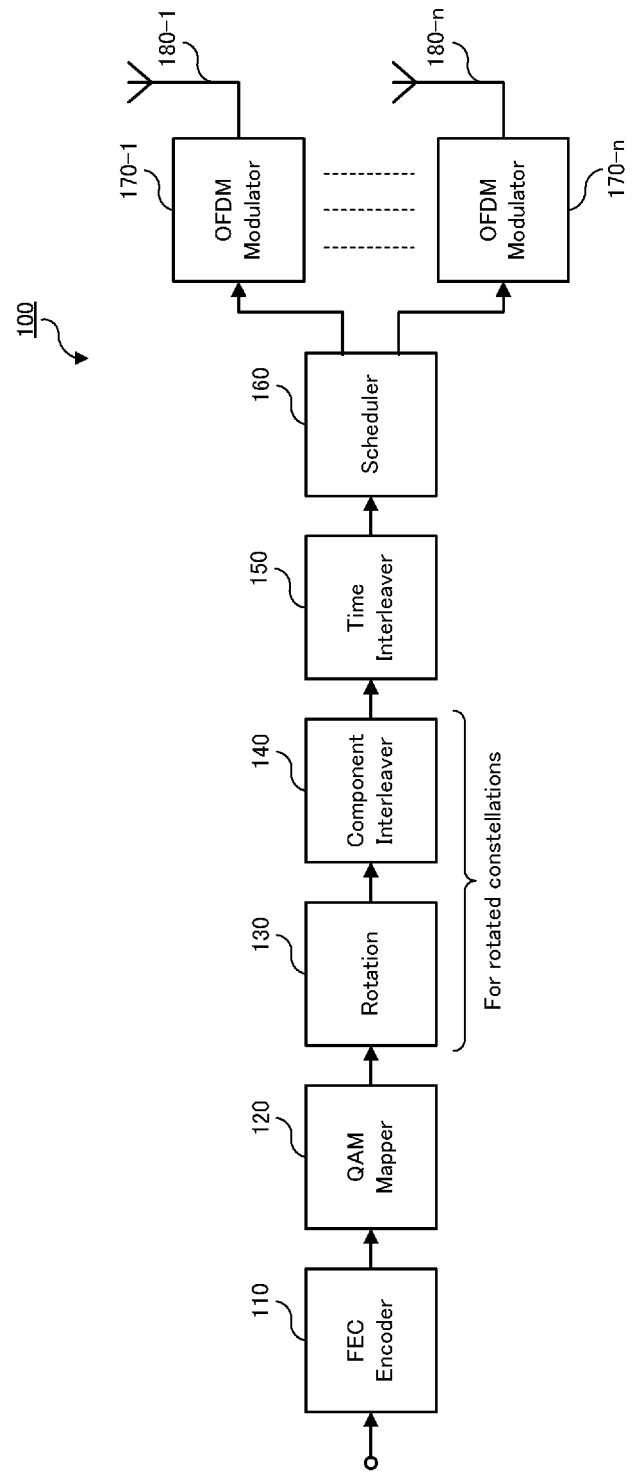
FIG. 1 is a block diagram showing the structure of a typical transmitter 100 that hops between a plurality of RF channels.

FIG. 1 is a block diagram showing the structure of a typical transmitter 100 that hops between a plurality of RF channels. The transmitter 100 is provided with a forward-error-correction (FEC) encoder 110, a quadrature amplitude modulation (QAM) mapper 120, a constellation rotation unit 130, a component interleaver 140, a time interleaver 150, a scheduler 160, OFDM modulators 170-1, . . . , 170-$n$, and transmission antennas 180-1, . . . , 180-$n$.

The transmitter 100 receives, as input, binary blocks of a predetermined length, which contain the information to be transmitted.

Each information block is encoded by the FEC encoder 110 using an FEC code, thus yielding FEC codewords. The encoding process includes calculation of redundant bits and addition of the redundant bits to the information block in order to make decoding of the information block by the receiver more robust against errors. Two notable examples of FEC code families are low-density parity-check (LDPC) codes and turbo codes. The present invention, however, does not particularly limit the type of FEC code used by the FEC encoder 110.

The FEC codeword yielded by the encoding process is provided to the QAM mapper 120. Hereinafter, an FEC codeword is referred to as an FEC block. The QAM mapper 120 maps the bits of the FEC block onto complex QAM symbols, mapping 2*B bits onto a complex QAM symbol at a time.

In greater detail, the QAM mapper 120 first maps the bits of FEC blocks onto real-valued pulse amplitude modulation (PAM) symbols, mapping B bits onto a PAM symbol at a time. Next, the QAM mapper 120 outputs a pair of real-valued PAM symbols as a complex QAM symbol (one of the real-valued PAM symbols is the real component of the complex QAM symbol, and the other real-valued PAM symbol is the imaginary component of the complex QAM symbol).

Each PAM symbol takes a value from a discrete set of $2^B$ values. How the B bits are mapped to PAM symbols is well understood and not directly relevant to the present invention. The relevant aspect is that each FEC block is transformed into a block of PAM symbols.

The FEC blocks are provided directly to the QAM mapper 120 in FIG. 1. Alternatively, the FEC blocks may be provided to the QAM mapper 120 via a bit interleaver not shown in figures.

The constellation rotation unit 130 demultiplexes the plurality of real-valued PAM symbols created by the QAM mapper 120 into D-dimensional vectors whose elements are D real-valued PAM symbols. These vectors can be regarded as identifying unique points in a D-dimensional space, the resulting $(2^B)^D$ combinations forming a D-dimensional constellation.

The constellation rotation unit 130 multiplies each D-dimensional vector by an orthogonal D-by-D matrix (letting the D-dimensional vector provided to the constellation rotation unit 130 be V, the orthogonal matrix used for matrix multiplication be R, and the D-dimensional rotation vector resulting from matrix multiplication be V', then V'=RV). Multiplication by the orthogonal matrix is regarded as a generalized rotation of a vector in the D-dimensional space, hence the term rotated constellations. As the present invention does not limit the orthogonal matrix used by the constellation rotation unit 130 to a rotation matrix with a particular structure, any orthogonal matrix may be used. Use of rotated constellations is a well-known technique in this technical field, and therefore a detailed explanation is omitted. Precise details can be found in Patent Literature 1 (EP 2 288 048), which is incorporated herewith in its entirety.

Rotated constellations are an effective tool for improving the robustness of communication systems under channels with heavy fading and erasures.

Preferably, D is a power of 2, such as 2, 4 or 8. Preferably, the number of PAM symbols per FEC block is a multiple of D.

In the following, the D-dimensional rotated vectors obtained by rotating vectors whose components are D real-valued PAM symbols are referred to as D-dimensional rotated constellation blocks (CB). The real symbols constituting a D-dimensional rotated constellation block are referred to as components or dimensions.

A two-dimensional constellation block is referred to as a 2D rotated constellation block or as a 2D-RC. Similarly, a four-dimensional constellation block is referred to as a 4D rotated constellation block or as a 4D-RC. Furthermore, an eight-dimensional constellation block is referred to as an 8D rotated constellation block or as a 8D-RC.

After D-dimensional rotation processing, the constellation rotation unit 130 maps D real symbols (components) of each D-dimensional rotated constellation block onto the real components and imaginary components of D/2 adjacent (continuous) complex symbols (initial mapping). Complex symbols are referred to as complex cells or simply as cells.

Figure 2A:
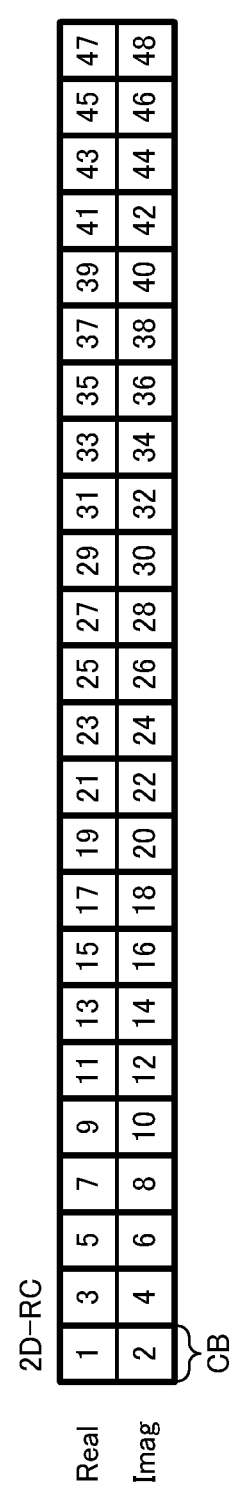
Figure 2B:
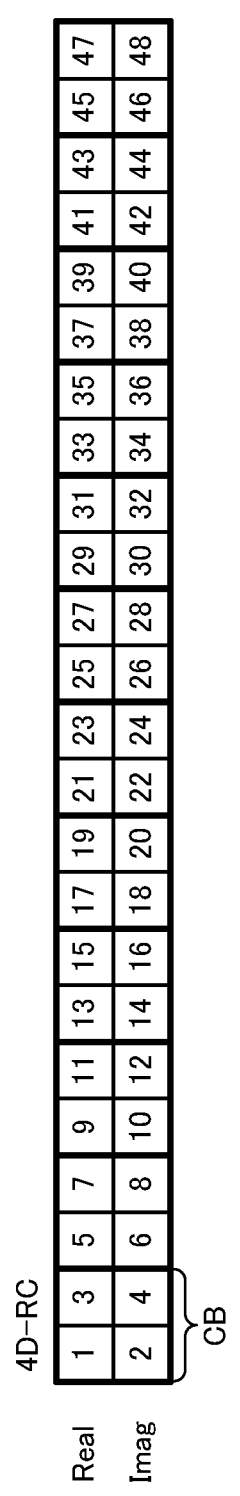

As a specific example, multi-dimensional rotated constellations in two, four, and eight dimensions are respectively shown in FIGS. 2A, 2B, and 2C. In this example, the number of real symbols in an FEC block is 48.

Note that in FIGS. 2A, 2B, and 2C, each of the smallest squares corresponds to one real symbol (component), and a vertical pair of two of the smallest squares corresponds to one complex symbol (complex cell). Each of the smallest rectangles outlined in bold corresponds to one multi-dimensional rotated constellation block (CB). Furthermore, in FIGS. 2A, 2B, and 2C, the number within each of the smallest squares (1, 2, . . . ) is an index indicating the real symbol (component).

In order for the rotated constellation to be effective in enhancing the robustness of the system, the fading experienced by the D components of each D-dimensional rotated constellation block must be as uncorrelated as possible, which is achieved by spreading the D components as evenly as possible over time and frequency. Typically, this is performed by (1) spreading the D components over the FEC block so that the D components of each D-dimensional rotated constellation block are mapped to different complex cells, then (2) by spreading the complex cells of each FEC block evenly over time and the available RF channels.

Step (1) is used only for rotated constellations and is performed by the component interleaver 140, while step (2) is used for both rotated and non-rotated constellations and is performed by the time interleaver 150 in conjunction with the scheduler 160. This will be explained in greater detail herebelow.

In order to achieve an even spreading of the D components of the D-dimensional rotated-constellation over time and the available RF channels, the two steps (1) and (2) must be correlated. Since the time interleaver 150 and the scheduler 160 are used also for non-rotated constellations, it follows that the spreading performed by the component interleaver 140 must be adapted according to the functionality of the time interleaver 150 and the scheduler 160.

In order to increase the time diversity of the system, the time interleaver 150 typically interleaves (by time interleaving) the complex cells of each FEC block with complex cells from one or more other FEC blocks. As a result, the complex cells of each FEC block are spread out in time.

The time interleaver 150 may be a block interleaver, a convolutional interleaver, or a combination of both. In the DVB-T2 standard (Digital Video Broadcasting-Second Generation Terrestrial) for example, the time interleaver 150 is a block interleaver. Further details on the DVB-T2 standard can be found in Non-Patent Literature 2 (the standardization document (ETSI EN 302.755) for DVB-T2), which is incorporated herewith in its entirety.

Figure 3:
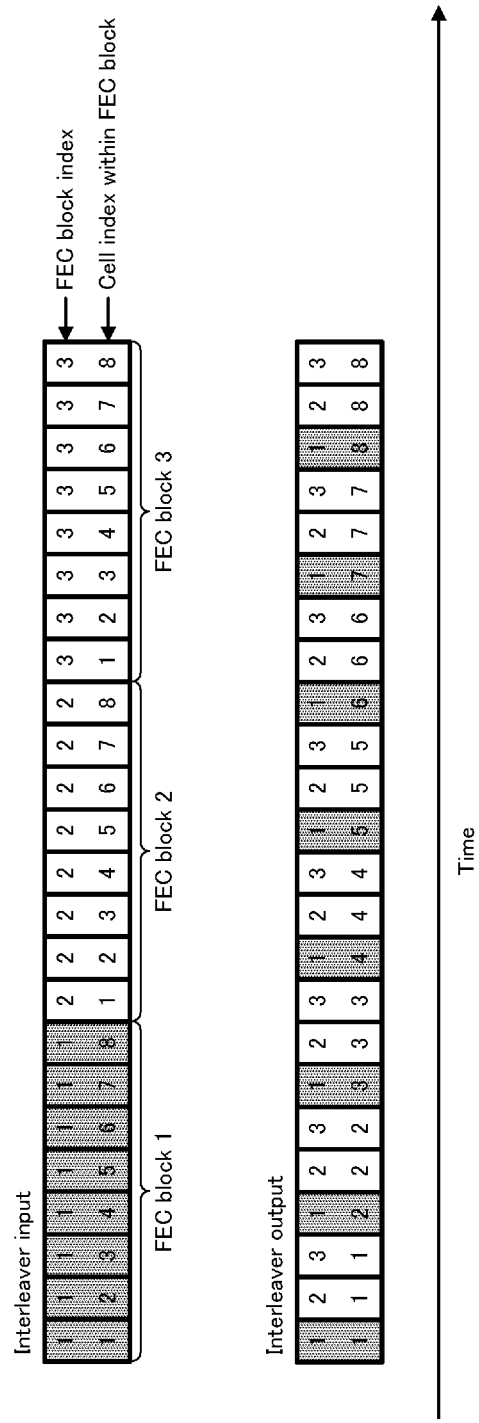
FIG. 3 illustrates an example of time interleaving.

FIG. 3 shows an example of a straightforward time interleaving scheme for the time interleaver 150. In this example, the number of FEC blocks is three, each FEC block consisting of eight complex cells. Note that in FIG. 3, each of the smallest rectangles corresponds to a complex cell. The upper number is the index of the FEC block, and the lower number is the index of the complex cell within the FEC block. In FIG. 3, to clarify the results of time interleaving, the eight complex cells for the FEC block with an index of 1 are shaded.

In the example in FIG. 3, the time interleaver 150 has rearranged the input in the following order: complex cell 1 of FEC block 1, complex cell 1 of FEC block 2, complex cell 1 of FEC block 3, complex cell 2 of FEC block 1, . . . .

As can be seen from FIG. 3, after time interleaving, the time interval over which the eight complex cells of an FEC block are transmitted becomes three FEC blocks. Time interleaving thus increases the time diversity. This time interval is also referred to as the interleaving duration.

The allocation of the time-interleaved complex cells to the available transmit resources is performed by the scheduler 160. The transmit resources can be time samples, in the case of single-carrier modulation, or multi-carrier symbols, in the case of multi-carrier modulation such as orthogonal frequency-division multiplexing (OFDM). In OFDM, the symbols themselves consist of a plurality of complex cells. In any case, the allocation by the scheduler 160 is assumed to be monotonic, i.e., the ordering of the complex cells in time is not changed. The scheduling (allocation) of the complex cells is typically signaled to the receiver through dedicated signaling information. When time-frequency slicing (TFS) is used, the scheduler 160 also allocates the cells to the available RF channels in a TFS group. This will be explained in greater detail herebelow.

For each RF channel the scheduler 160 output is further processed by a chain comprising at least OFDM modulators 170-1, . . . , 170-n, up-converters (not shown in the figures) corresponding to the plurality of OFDM modulators, and radio-frequency (RF) power amplifiers (not shown in the figures) corresponding to the plurality of up-converters. The OFDM modulators 170-1, . . . , 170-n may include frequency interleaving for increased frequency diversity. Each up-converter converts the digital baseband signal from the corresponding OFDM modulator to an analog RF signal. Each RF power amplifier amplifies the power of the analog RF signal from the corresponding up-converter. The analog RF signal whose power has been amplified by the RF power amplifier is transmitted by a corresponding one of the transmission antennas 180-1, . . . , 180-n.

Regarding the temporal separation of the complex component constituting the constellation, the best performance in a system with rotated constellations is obtained when the D components of a D-dimensional rotated constellation block are evenly spread over the entire time-interleaving duration. Depending on the concrete scheduling and slicing of the FEC block, meeting this condition exactly may not always be possible. The best solution, which works reasonably well in most cases, is to spread the D components of a D-dimensional rotated constellation block evenly over the FEC block. The complex cells of the FEC block are then transmitted over the time-interleaver period, and in the stated order.

One approach for increasing the reliability of a communication system is to exploit the diversity available over a plurality of RF channels, hereafter referred to as channel diversity. The main type of channel diversity is the frequency diversity, which results from the fact that fading in wireless channels tends to be frequency selective and thus the fading correlation between any two RF channels is relatively low. Moreover, if the transmitters for the different RF channels are located in different geographical locations, also the so-called spatial diversity is exploited. The channel diversity results therefore from both the frequency and the spatial diversity.

In a transmission system with a plurality of RF channels, in order to enable reception with a single tuner in the receiver, the information to be received continuously, e.g. a broadcast program, must not be sent over more than one RF channel at any given time. It is therefore necessary to use TFS scheduling, so that the receiver can hop from one frequency to the other and extract the desired data from each RF channel during the appropriate slice based on TFS scheduling information (information that indicates the time and frequency allocation of each slice). The TFS scheduling information is typically signaled to the receiver through dedicated signaling information.

Figure 4:
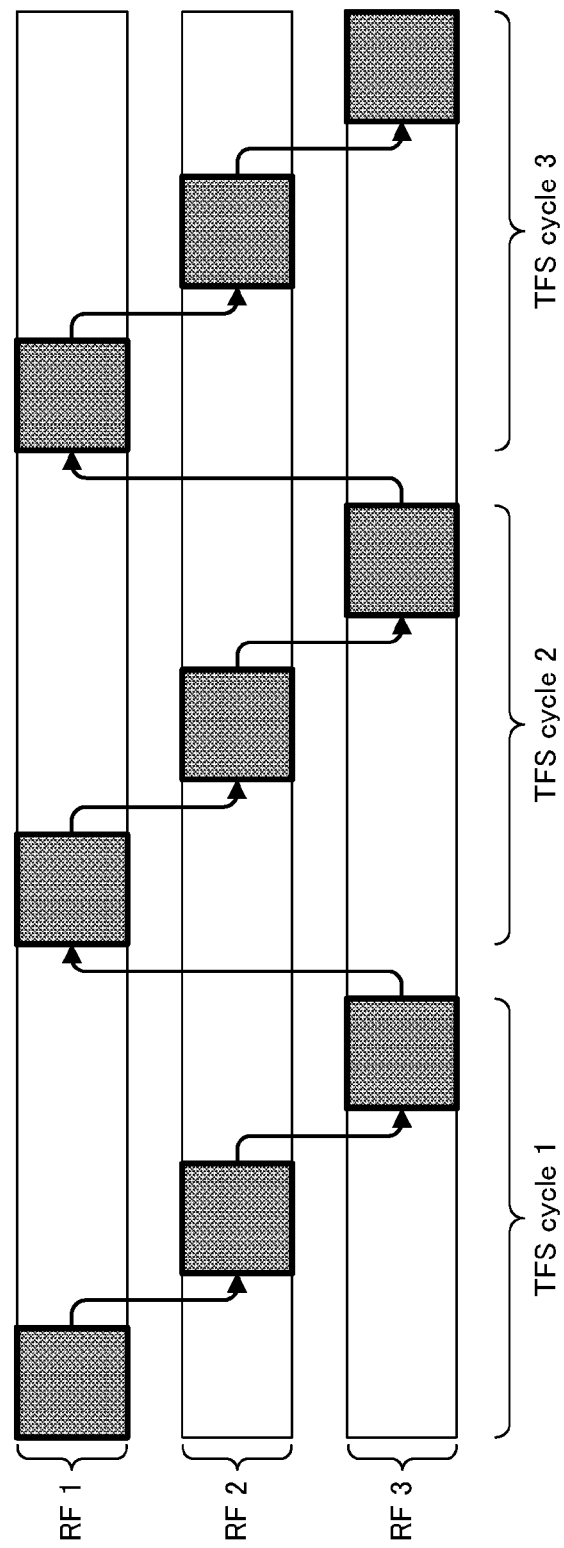
FIG. 4 illustrates an example of time-frequency slicing when the number of RF channels is three and the number of TFS cycles is three.

FIG. 4 shows an example of TFS scheduling. In the example in FIG. 4, the number of RF channels is three, and the number of TFS cycles is three. The scheduler 160 allocates (outputs to the OFDM modulator) nine slices in order over RF channels, repeating the order of RF channel 1, 2, and 3. In order to allow the tuner to hop between two RF channels, a guard interval is required between two consecutive slices.

In the following, the number of RF channels in a TFS group is denoted by $N_{RF}$ and the number of TFS cycles over which a FEC block is spread by $N_C$. The number of slices of a FEC block is therefore $N_S = N_{RF} * N_C$.

Figure 5:
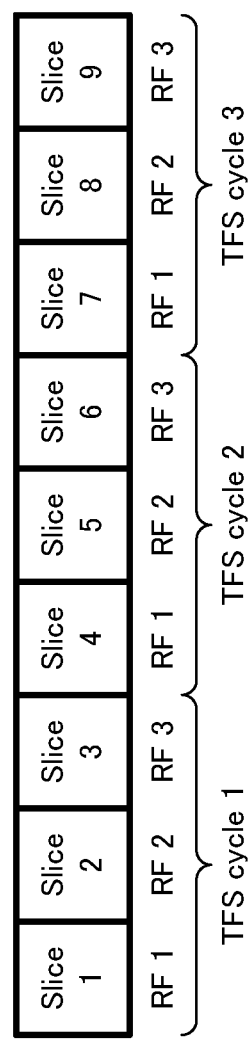
FIG. 5 illustrates an example of slicing a FEC block when the number of RF channels is three and the number of TFS cycles is three.

An optimal diversity is achieved when all slices have the same length and each FEC block has the same number of complex cells in all slices. FIG. 5 shows an example of spreading a FEC block over TFS slices. In the example in FIG. 5, the number of RF channels is three, and the number of TFS cycles is three, corresponding to the TFS scheduling example in FIG. 4. The slicing process is straightforward.

When rotated constellations are used, the D components of a D-dimensional rotated constellation block must be mapped evenly onto the RF channels. For example, for 2D rotated constellations the two components must be mapped onto all possible pairs of RF channels. For three RF channels these pairs are: (1,2), (1,3), (2,3). Mapping the two components of the D-dimensional rotated constellation block onto the same RF channel must be avoided.

To summarize, component interleaving by the component interleaver 140 must ensure that the components of the constellation block are 1) spread as evenly as possible over the time-interleaving duration, and 2) mapped to all possible combinations of RF channels for the TFS cases.

When both of these conditions (1) and (2) cannot be met, it is preferable to guarantee the latter at the expense of the former.

A conventional solution for component interleaving is disclosed in Non-Patent Literature 1 (DVB-NGH Standardization Document TM-NGH1172 published internally by the DVB organization). This document is authored by Marco Breiling from the Fraunhofer Institute for Integrated Circuits (IIS) in Erlangen, Germany, and is entitled "Details of the Cell+Time Interleaving".

The conventional component interleaver 140 works on FEC blocks and applies a different permutation to the real and the imaginary components of the complex cells of the FEC block. The component interleaver 140 is optimized for 2D rotated constellation blocks, where the two components of 2D rotated constellation blocks are initially mapped onto the real and the imaginary components of complex cells, respectively, as in FIG. 2A.

Operations of the component interleaver 140 are now described in detail.

The component interleaver 140 receives a plurality of complex cells of a FEC block (complex cells obtained by initial mapping). The component interleaver 140 writes the complex cells column by column into an interleaver matrix with $N_R$ rows. In greater detail, the component interleaver 140 writes each real component and imaginary component of the complex cells column by column into a real-component interleaver matrix and an imaginary-component interleaver matrix each having the same structure and $N_R$ rows. $N_R$ is a parameter of the interleaver matrices.

Next, the component interleaver 140 applies cyclic shifts to the columns of the imaginary-component interleaver matrix based on a predetermined shift pattern in order to introduce a separation between the real and the imaginary components of each cell. The shifts are not the same for all columns. Instead, the predetermined shift pattern is the amounts of shift (1, 2, . . . , $N_R-1$) for the first $N_R-1$ columns. This predetermined shift pattern (1, 2, . . . , $N_R-1$) is then repeated for the remaining columns. In other words, the amount of shift that is applied to a given column is determined by a corresponding entry of the shift pattern which is a sorted set of integers. The "corresponding" entry means the first entry for the first column, the second entry for the second column, and so on, with the shift pattern being periodically continued. Instead of periodically continuing the shift pattern, the entry may also be cyclically selected from the shift pattern, i.e. selected as the remainder after dividing by the length of the shift pattern.

The component interleaver 140 then reads out the real components and the imaginary components row by row from the real-component interleaver matrix and the imaginary-component interleaver matrix, sequentially forming complex cells from the read out real components and imaginary components and outputting the complex cells to subsequent processing blocks. The real component and imaginary component of a complex cell are the real component and imaginary component in the same row and the same column after cyclic shifting. The result is a FEC block divided into $N_R$ slices of equal size. The distance between the real component and the imaginary component in a complex cell output by the constellation rotation unit 130 is therefore at least $1/N_R$ of the number of complex cells in a FEC block.

An example of component interleaving by the component interleaver 140 is shown in FIGS. 6 through 9. In the example in FIGS. 6 through 9, the number of complex cells of a FEC block is 48. Note that in FIGS. 6, 7, 8, and 9, as well as in FIGS. 11, 14, 15, 16, 17, 18, 21, 22, 23, and 24, described below, each of the smallest squares corresponds to one real component or one imaginary component of one complex cell. Furthermore, in FIG. 9, and in FIG. 17 described below, a vertical pair of two of the smallest squares corresponds to one complex cell. Additionally, in FIGS. 6, 7, 8, and 9, as well as in FIGS. 11, 14, 15, 16, 17, 18, 21, 22, 23, and 24, described below, the number within each of the smallest squares (1, 2, . . . ) is an index indicating the complex cell within the FEC block output by the constellation rotation unit 130.

Figure 6:
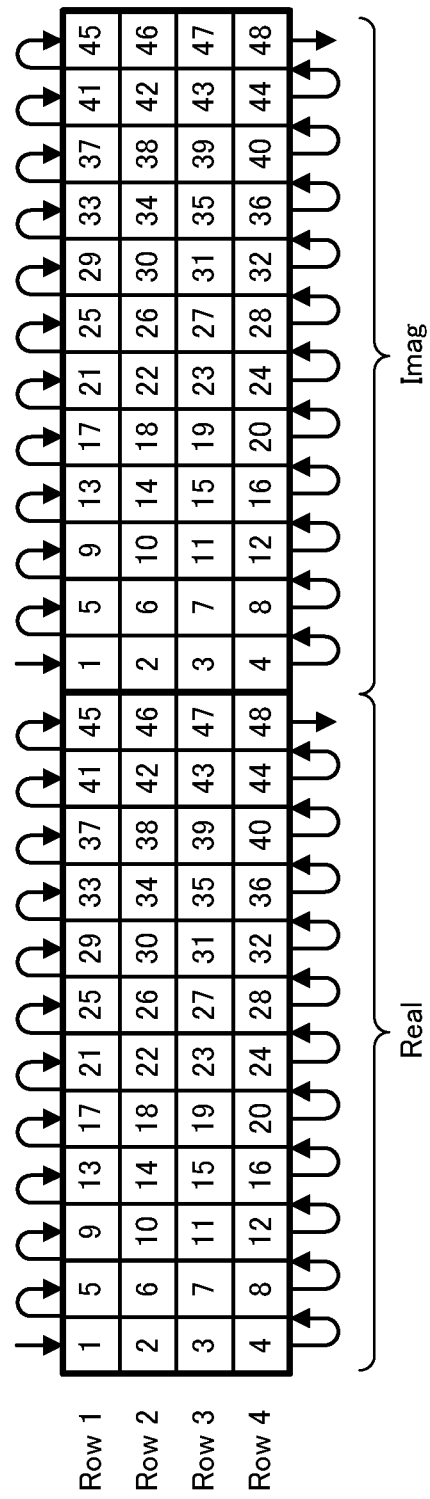
FIG. 6 illustrates an example of the component interleaver 140 in FIG. 1 writing the real components and imaginary components of a plurality of complex symbols into a real-component interleaver matrix and an imaginary-component interleaver matrix.

First, the component interleaver 140 writes the real components and imaginary components of 48 complex cells, in the order indicated by the arrows in FIG. 6, column by column into a real-component interleaver matrix and an imaginary-component interleaver matrix with $N_R=4$.

Figure 7:
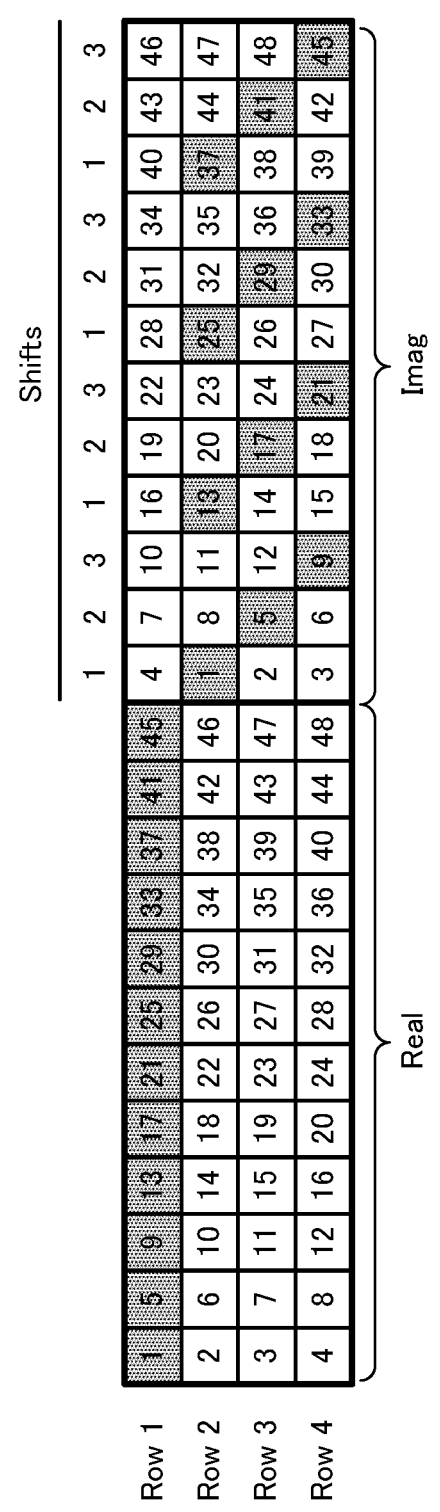

Next, the component interleaver 140 applies cyclic shifts 1, 2, 3, 1, . . . to the first, second, third, fourth, . . . , columns of the imaginary-component interleaver matrix in FIG. 6. The result of applying the cyclic shifts to FIG. 6 is shown in FIG. 7.

Figure 8:
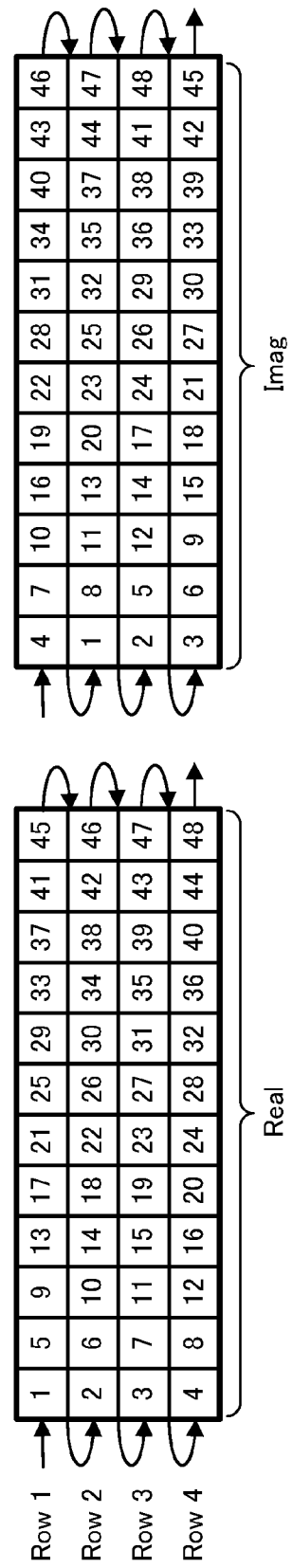
FIG. 8 illustrates an example of the component interleaver 140 in FIG. 1 reading real components and imaginary components from the real-component interleaver matrix and the imaginary-component interleaver matrix.
Figure 9:
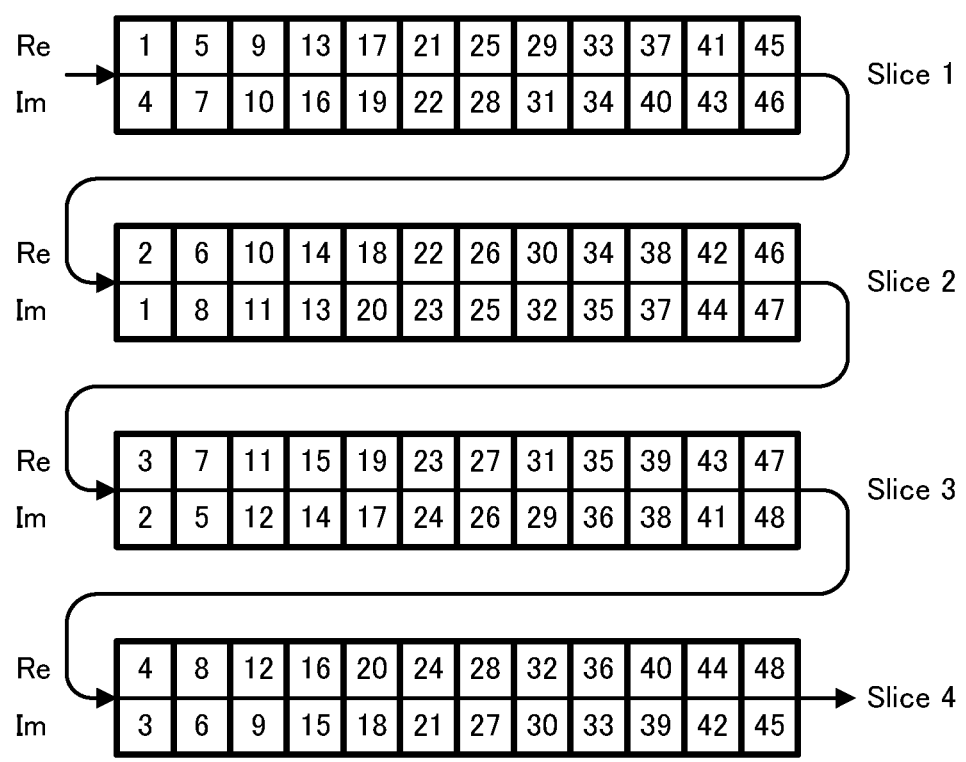
FIG. 9 illustrates an example of the component interleaver 140 in FIG. 1 mapping the real components and imaginary components read from the real-component interleaver matrix and the imaginary-component interleaver matrix to complex symbols.

Furthermore, the component interleaver 140 reads out the real components and imaginary components row by row from the real-component interleaver matrix and the imaginary-component interleaver matrix in the order indicated by the arrows in FIG. 8, thus forming complex cells from the read out real components and imaginary components, as shown in FIG. 9, and outputting the complex cells. The result is a FEC block divided into $N_R=4$ slices of equal size. In the case of a 2D rotated constellation, the two components of the 2D rotated constellation are mapped onto different complex cells. The distance between the two components is at least $1/N_R$ of the number of complex cells in a FEC block.

All combinations of two different slices are possible and occur with the same frequency, as shown in FIG. 10 for $N_R=4$. The value (1, 2, 3) of each square in FIG. 10 is the distance in slices between two components of the 2D rotated constellation block after component interleaving by the component interleaver 140.

More exactly, the distance in slices between the two components of a 2D rotated constellation belongs to the following discrete set: 1, 2, . . . , $N_R-1$. Unlike the distance between slices, not all distances occur with the same frequency. Larger distances occur less frequently than smaller distances, and the resulting histogram resembles a triangle.

The component interleaver 140 is ideal for TFS when the number of rows $N_R$ is chosen to be equal to the number of RF channels $N_{RF}$. For 2D rotated constellations, the two components of the 2D rotated constellation block are mapped onto all possible RF channel pairs. For example, in the case of TFS with 4 RF channels, these pairs of indices are: (1, 2), (1, 3), (1, 4), (2, 3), (2, 4), and (3, 4).

When a FEC block is interleaved over multiple TFS cycles, the number of rows $N_R$ is chosen to be equal with the number of TFS slices per FEC block $N_S=N_{RF}*N_C$. As described above, $N_{RF}$ is the number of RF channels in the TFS group, and $N_C$ is the number of TFS cycles. The periodic shift pattern will still be $(1, 2, \ldots, N_R-1)$.

The component interleaver 140 has a problem when a FEC block is interleaved over multiple TFS cycles in that the two components of some 2D rotated constellation blocks get mapped onto the same RF channel.

More specifically, among a plurality of 2D rotated constellation blocks, the two components of the 2D rotated constellation block are mapped to the same RF channel when the 2D rotated constellation block includes an imaginary component written into a column of the imaginary-component interleaver matrix for which the cyclic shift is a multiple of $N_{RF}$.

Figure 11:
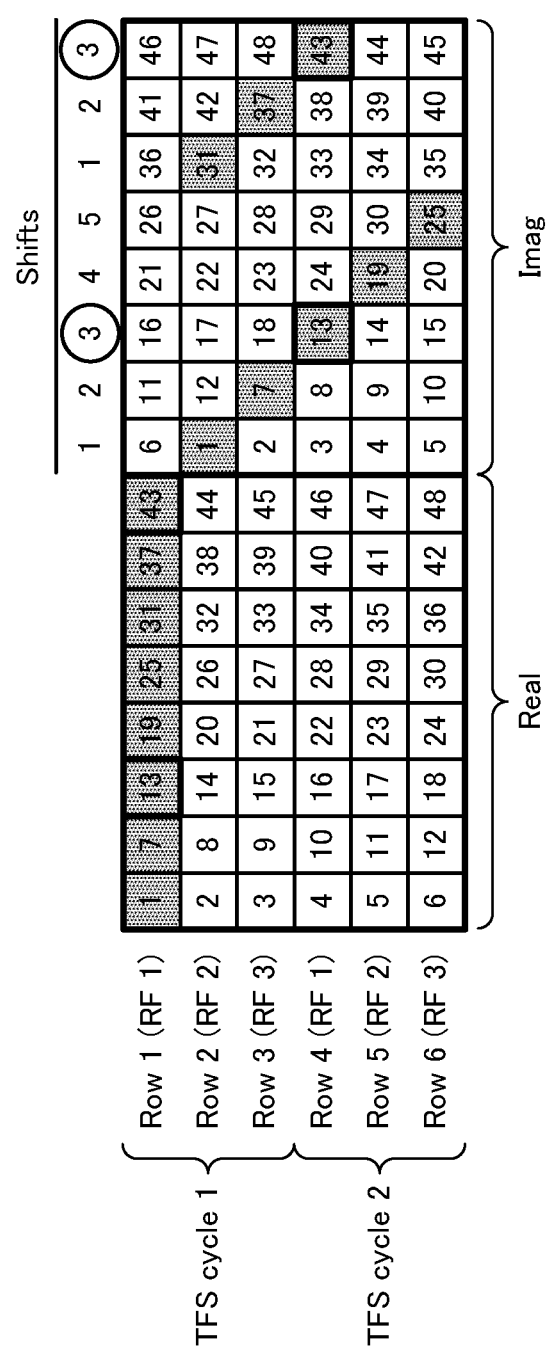

FIG. 11 shows a specific example. In the example in FIG. 11, the number of RF channels $N_{RF}$ is three, and the number of TFS cycles $N_C$ is two. Furthermore, FIG. 11 lists information showing the TFS cycle and the RF channel to which the real component and the imaginary component of each complex cell are allocated as a result of initial mapping.

In FIG. 11, comparing the third column and the eighth column in the real-component interleaver matrix, to which has been applied a periodic shift of three, which is a multiple of $N_{RF}$, with the third column and the eighth column in the imaginary-component interleaver matrix reveals that two components of a constellation block (a real component and an imaginary component of a complex cell) are mapped to the same RF channel. As a result, the performance of the component interleaver 140 is not optimal.

Based on the above observations, the inventor understood that by including all of the shifts $1, 2, \ldots, N_R-1$ used by a conventional component interleaver 140, the interleaving of the constellation block components is not optimal in all configurations.

The inventor therefore examined what configurations would not be optimal for component interleaving using all of the shift patterns $1, 2, \ldots, N_R-1$.

As a result of this examination, the inventor discovered two notable configurations: (1) when not using TFS, and (2) when using TFS that includes a plurality of TFS cycles per time interleaving duration.

An aspect of the present invention improves the performance of component interleaving by reducing the number of possible shifts in the shift pattern. The number of distinct shifts in the shift pattern is less than $N_R-1$.

Embodiment 1 below describes a component interleaver that does not use TFS, and Embodiment 2 describes a component interleaver that uses TFS including a plurality of TFS cycles over a time interleaving duration.

Embodiment 1

When not using TFS, the D components of a D-dimensional rotated constellation should be spread evenly over the FEC block.

In frame-based communication systems, when a FEC block is spread over several frames ($N_F>1$), the D components of each constellation block must be distributed as evenly as possible among the $N_F$ frames. If D is larger than $N_F$, some frames will carry two or more components from some constellation blocks. In that case, these components must be spread over the frame as evenly as possible.

FIGS. 12A through 12D illustrate examples of spreading the components of a 2D rotated constellation block (2D-RC) and a 4D rotated constellation block (4D-RC).

FIGS. 12A, 12B, 12C, and 12D show an example of mapping two components of a 2D-RC and of mapping four components of a 4D-RC when a FEC block is mapped to one frame, two frames, three frames, and four frames respectively.

In each of FIGS. 12A through 12D, each of the smallest squares corresponds to one component. The groups of shaded squares in each figure represent two components of the same 2D-RC and four components of the same 4D-RC.

Figure 12A:
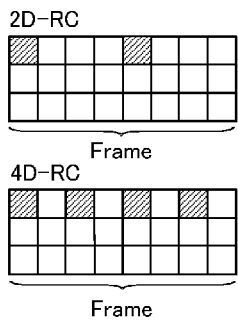
FIG. 12A schematically illustrates the spreading of a FEC block over one frame.
Figure 12B:
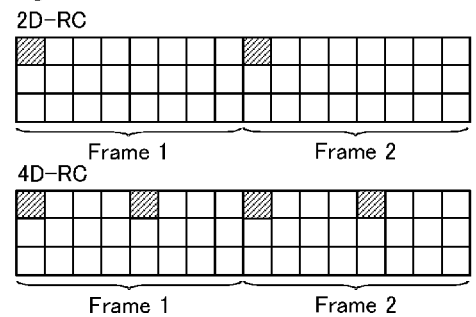
FIG. 12B schematically illustrates the spreading of a FEC block over two frames.
Figure 12C:
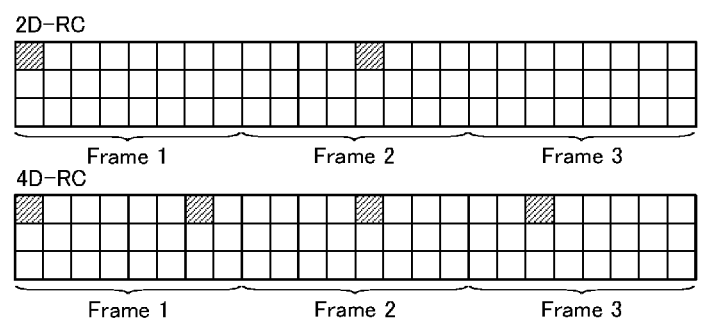
FIG. 12C schematically illustrates the spreading of a FEC block over three frames.
Figure 12D:
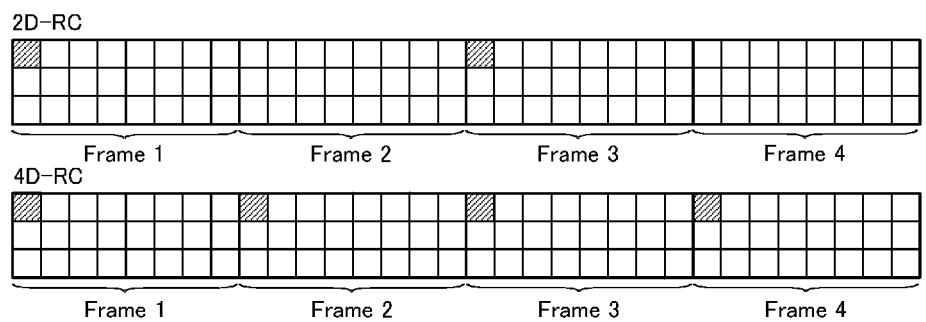
FIG. 12D schematically illustrates the spreading of a FEC block over four frames.

When each 2D-RC is spread over four frames, mapping the two components of a 2D-RC one each onto frame 1 and frame 3, or onto frame 2 and frame 4, guarantees that the time interval between two components of every 2D-RC is two frames. Therefore, it can easily be seen that the mapping shown by the example in FIG. 12D is optimal.

Mapping the two components of a 2D-RC one each onto frame 1 and frame 2, or onto frame 3 and frame 4, makes the time interval between the two components of every 2D-RC the same, but the time interval is only one frame. Furthermore, mapping the two components of a 2D-RC one each onto frame 1 and frame 4, or onto frame 2 and frame 3, makes the average time interval between the two components of every 2D-RC two frames, but the time interval between the two components of a 2D-RC is not the same for every 2D-RC (i.e. the time interval is either one frame or three frames). Accordingly, as compared to the mapping shown by the example in FIG. 12D, these are not good mappings.

In Embodiment 1, in order to spread out the D components of a D-dimensional rotated constellation block over a FEC block, (A1) the number of rows $N_R$ of the real-component interleaver matrix and the imaginary-component interleaver matrix is chosen to be exactly D, and (A2) a cyclic shift of D/2 is applied to all of the columns of the imaginary-component interleaver matrix.

With reference to the figures, the following describes a transmitter and a transmission method for implementing component interleaving that satisfies (A1) and (A2).

Transmitter and Transmission Method

Figure 13:
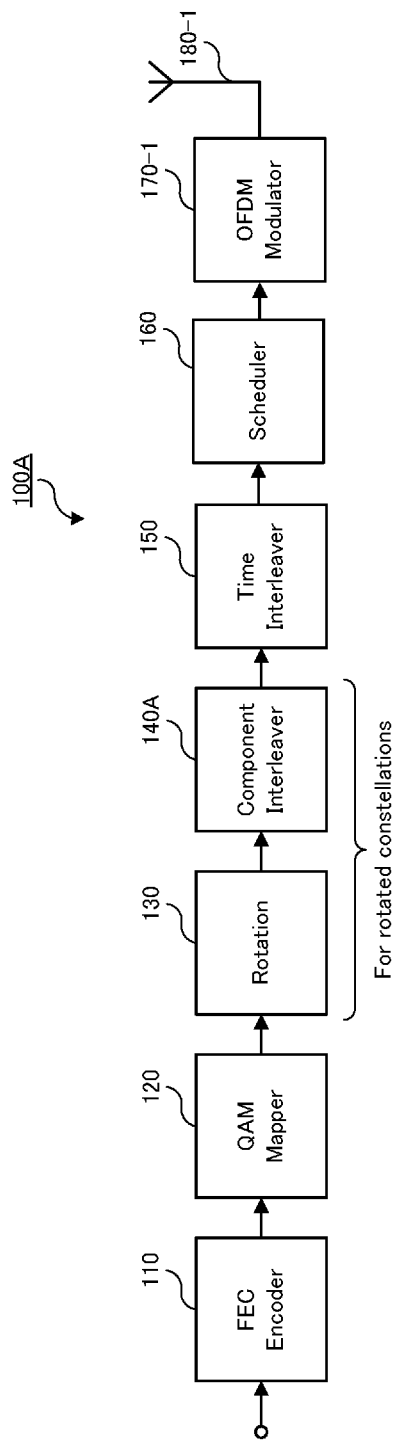
FIG. 13 is a block diagram illustrating the structure of a transmitter 100A in Embodiment 1.

FIG. 13 is a block diagram illustrating the structure of a transmitter 100A in Embodiment 1 of the present invention. In Embodiment 1, the same reference signs are used and a description is omitted for constituent elements to which applies the description of the constituent elements of the transmitter 100 in FIG. 1 as listed in the section "Examination and Discovery by the Inventor" above.

In the transmitter 100A in FIG. 13, the component interleaver 140 of the transmitter 100 in FIG. 1 is replaced by a component interleaver 140A. Furthermore, the OFDM modulators other than the OFDM modulator 170-1 and the transmission antennas other than the transmission antenna 180-1 are removed. In Embodiment 1, TFS is not used. Therefore, the scheduler 160 in Embodiment 1 does not require a function to allocate slices to RF channels.

The component interleaver 140A receives a plurality of complex cells of a FEC block (complex cells obtained by initial mapping).

The component interleaver 140A writes each real component and imaginary component of the complex cells column by column into a real-component interleaver matrix and an imaginary-component interleaver matrix each having the same structure and D rows. Next, the component interleaver 140A applies cyclic shifts of D/2 to the columns of the imaginary-component interleaver matrix. The component interleaver 140A then reads out the real components and imaginary components row by row from the real-component interleaver matrix and the imaginary-component interleaver matrix, forming complex cells from the read out real components and imaginary components and outputting the complex cells to subsequent processing blocks. The real component and imaginary component of a complex cell are the real component and imaginary component in the same row and the same column after cyclic shifting.

The FEC block output by the component interleaver 140A is composed of D continuous sections of equal size. The D components of each D-dimensional rotated constellation block are included one by one in the sections and thus are spread evenly over the FEC block.

With reference to FIGS. 14 through 17, the following describes an example of component interleaving by the component interleaver 140A. In the example, the constellation is a 2D rotated constellation, and the number of complex cells in the FEC block is 24.

Figure 14:
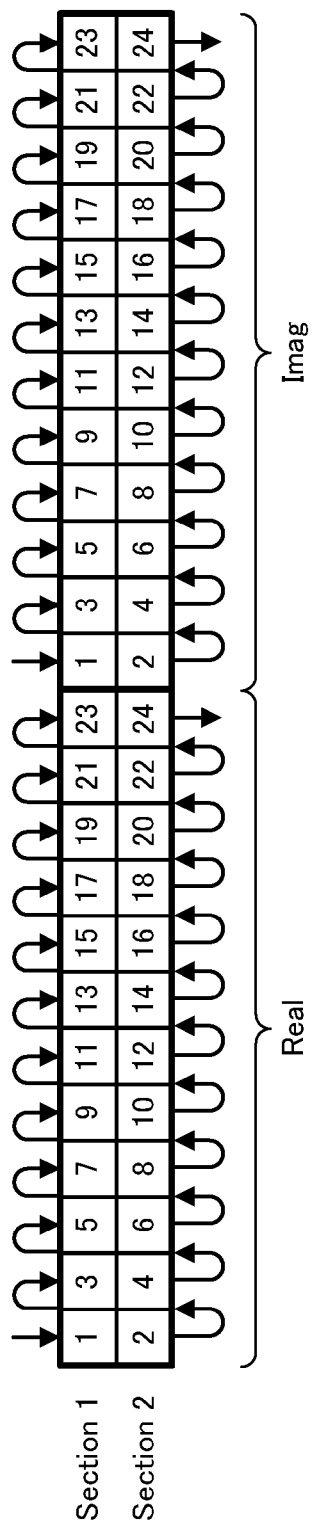
FIG. 14 illustrates an example of the component interleaver 140A in FIG. 13 writing the real components and imaginary components of a plurality of complex symbols into a real-component interleaver matrix and an imaginary-component interleaver matrix.

First, the component interleaver 140A writes the real components and imaginary components of 24 complex cells column by column in the direction indicated by the arrows in FIG. 14 into a real-component interleaver matrix and an imaginary-component interleaver matrix each having D=2 rows.

Figure 15:
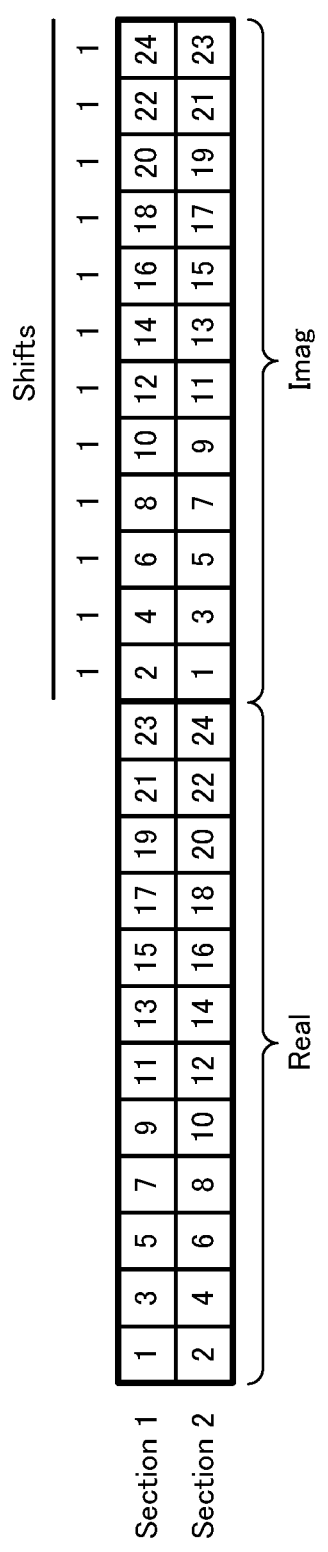

Next, the component interleaver 140A applies cyclic shifts of D/2=1 to the columns of the imaginary-component interleaver matrix in FIG. 14. FIG. 15 illustrates the results of applying cyclic shifts to FIG. 14.

Figure 16:
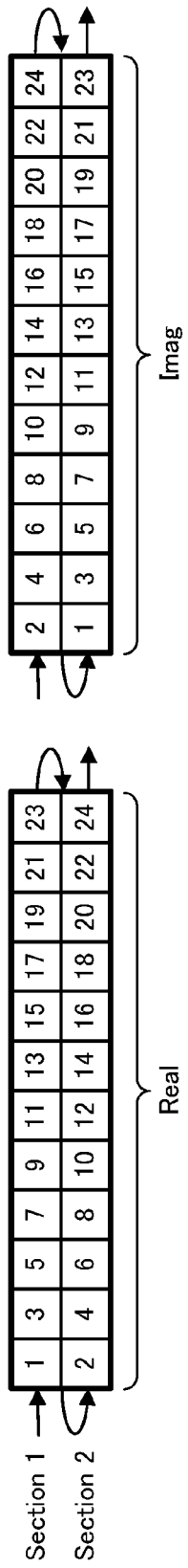
FIG. 16 illustrates an example of the component interleaver 140A in FIG. 13 reading the real components and imaginary components read from the real-component interleaver matrix and the imaginary-component interleaver matrix.
Figure 17:
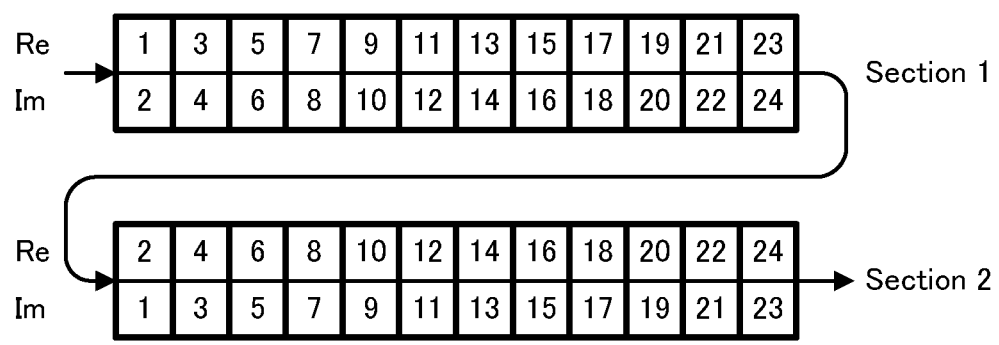
FIG. 17 illustrates an example of the component interleaver 140A in FIG. 13 mapping the real components and imaginary components read from the real-component interleaver matrix and the imaginary-component interleaver matrix to complex symbols.

Furthermore, the component interleaver 140A reads out the real components and imaginary components row by row from the real-component interleaver matrix and the imaginary-component interleaver matrix in the direction of the arrows in FIG. 16, forming complex cells from the read out real components and imaginary components as illustrated in FIG. 17 and outputting the complex cells.

With reference to FIG. 18, the following describes another example of component interleaving by the component interleaver 140A. In this example, the constellation is a 4D rotated constellation, and the number of complex cells in the FEC block is 24.

First, the component interleaver 140A writes the real components and imaginary components of 24 complex cells column by column into a real-component interleaver matrix and an imaginary-component interleaver matrix each having D=4 rows.

Next, the component interleaver 140A applies cyclic shifts of D/2=2 to the columns of the imaginary-component interleaver matrix. FIG. 18 illustrates the results of applying cyclic shifts.

Furthermore, the component interleaver 140A reads out the real components and imaginary components row by row from the real-component interleaver matrix and the imaginary-component interleaver matrix, forming complex cells from the read out real components and imaginary components and outputting the complex cells.

Receiver and Reception Method

Figure 19:
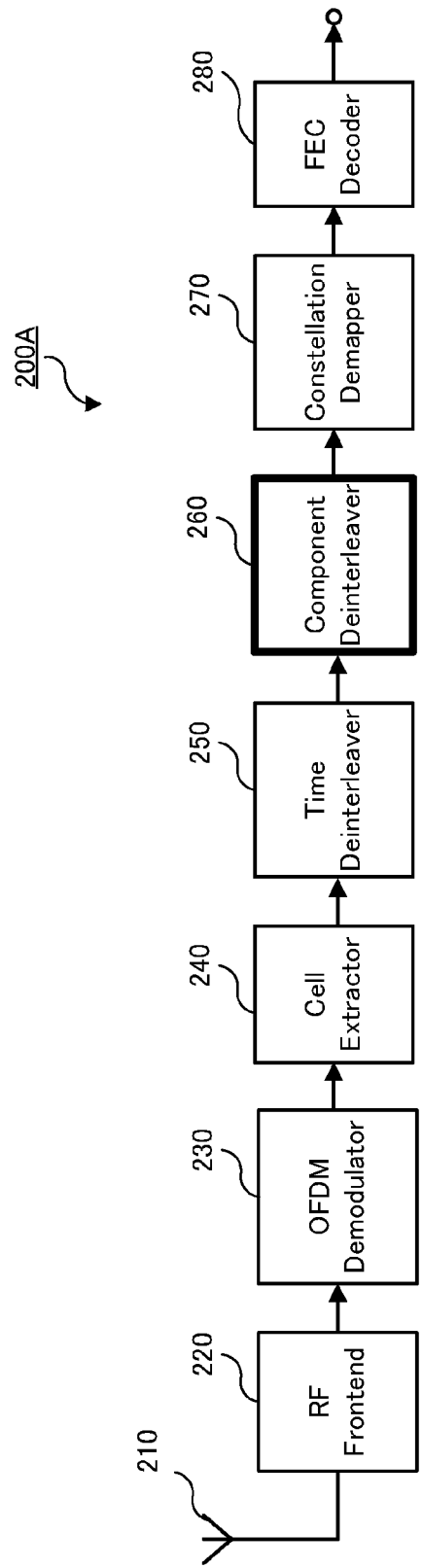
FIG. 19 is a block diagram illustrating the structure of a receiver 200A in Embodiment 1.

FIG. 19 is a block diagram illustrating the structure of a receiver 200A in Embodiment 1 of the present invention. The receiver 200A in FIG. 19 mirrors the functionality of the transmitter 100A in FIG. 13.

The receiver 200A is provided with a reception antenna 210, a radio-frequency (RF) frontend 220, an OFDM demodulator 230, a cell extractor 240, a time deinterleaver 250, a component deinterleaver 260, a constellation demapper 270, and a forward error correction (FEC) decoder 280.

The RF frontend 220 receives, as input, a signal received by the reception antenna 210 and is provided with a tuner (not shown in the figures) for tuning into a desired channel from the received signal and with a down-converter (not shown in the figures) for converting the analog RF signal to digital baseband. For the non-TFS case, the RF frontend 220 always receives the same RF channel, and TFS scheduling information for hopping between RF channels is unnecessary.

The OFDM demodulator 230 receives the baseband signal from the RF frontend 220 and performs OFDM demodulation on the received digital baseband signal. In other words, the OFDM demodulator 230 calculates channel fading coefficients based on the digital baseband signal and calculates complex symbols (complex cells) based on the calculated channel fading coefficients. The OFDM demodulator 230 then outputs a stream of complex cells to the cell extractor 240.

The cell extractor 240 extracts complex cells belonging to the desired service or program from the cell stream according to the allocation information signaled by the transmitter. The time deinterleaver 250 deinterleaves (time deinterleaving) the extracted complex cells so as to return the cells to the order before interleaving by the time interleaver 150 of the transmitter 100A. As a result of time deinterleaving, the extracted complex cells are grouped into FEC blocks, each FEC block comprising a predetermined number of complex cells.

So as to return the real components and the imaginary components of the complex cells in each FEC block to the order before interleaving by the component interleaver 140 of the transmitter, the component deinterleaver 260 deinterleaves the complex cells (component deinterleaving) by applying the opposite permutation of the permutation applied by the component interleaver 140 to the real components and the imaginary components.

For example, the component deinterleaver 260 writes each real component and imaginary component of the complex cells row by row into a real-component interleaver matrix and an imaginary-component interleaver matrix each having the same structure and D rows. Note that the real-component interleaver matrix and the imaginary-component interleaver matrix used by the component deinterleaver 260 have the same structure as the real-component interleaver matrix and the imaginary-component interleaver matrix used by the component interleaver 140A of the transmitter 100A.

Next, the component deinterleaver 260 applies cyclic shifts of D/2 to the columns of the imaginary-component interleaver matrix. Since the number of rows in the interleaver matrix is D, a cyclic shift of D/2 is equivalent to a cyclic shift of −D/2.

The component deinterleaver 260 then reads out the real components and the imaginary components column by column from the real-component interleaver matrix and the imaginary-component interleaver matrix, forming complex cells from the read out real components and imaginary components and outputting the complex cells to subsequent processing blocks. The real component and imaginary component of a complex cell are the real component and imaginary component in the same row and the same column after cyclic shifting.

From the complex cells output by the component deinterleaver 260, the constellation demapper 270 extracts D/2 complex cells corresponding to D real symbols of each D-dimensional constellation block. The constellation demapper 270 then demodulates the D/2 extracted complex cells as a group by creating D*B "soft" bits for each group. Note that in one processing step, the constellation demapper 270 performs derotation corresponding to the rotation by the constellation rotation unit 130 of the transmitter 100A and demapping corresponding to the mapping by the QAM mapper 120 of the transmitter 100A.

The FEC decoder 280 decodes the soft bits of each FEC block in accordance with the FEC code used by the FEC encoder 110 of the transmitter 100A and provides the results of decoding to subsequent processing blocks for further processing.

Embodiment 2

When using TFS that includes a plurality of TFS cycles per time interleaving duration, as described above, the shift pattern used for cyclic shifts by a conventional component interleaver 140 is not optimal.

With reference to the figures, the following describes a transmitter and a transmission method that employ a shift pattern that is an improvement over the shift pattern used for cyclic shifts by a conventional component interleaver 140.

Transmitter and Transmission Method

Figure 20:
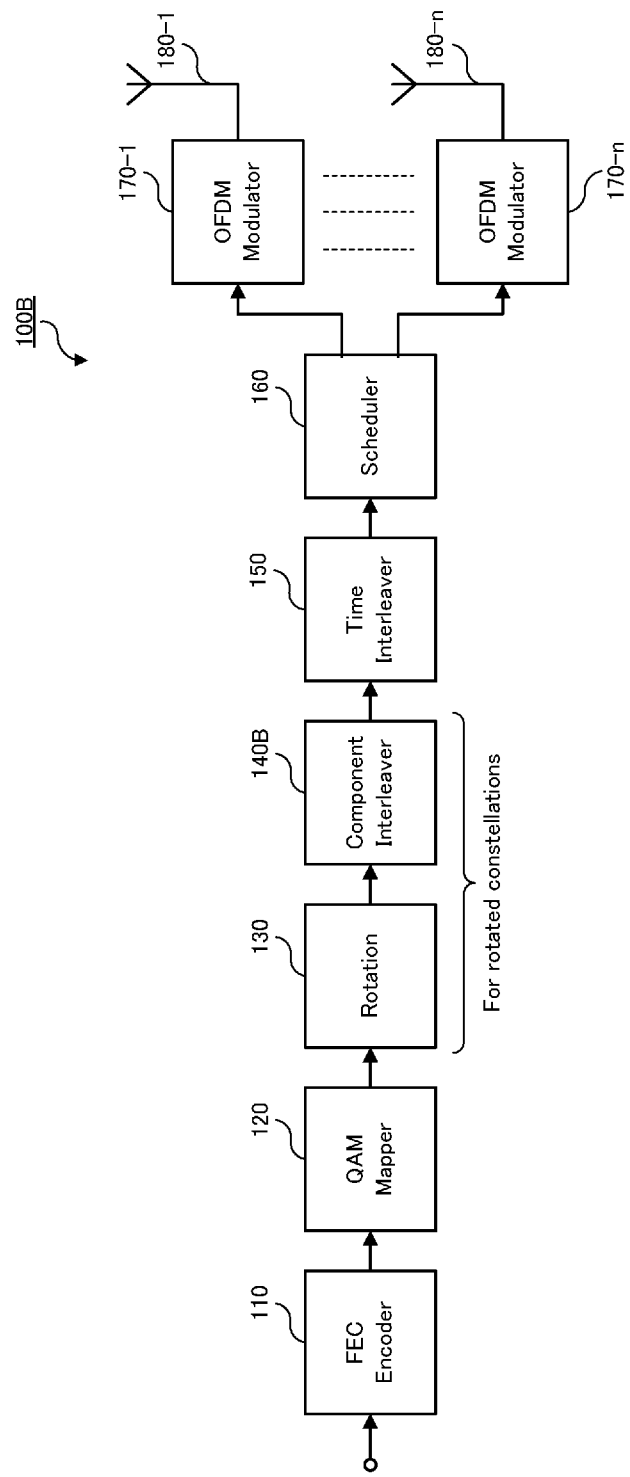
FIG. 20 is a block diagram illustrating the structure of a transmitter 100B in Embodiment 2.

FIG. 20 is a block diagram illustrating the structure of a transmitter 100B in Embodiment 2 of the present invention. Note that Embodiment 2 targets the case of two or more RF channels and two or more TFS cycles. In Embodiment 2, the same reference signs are used and a description is omitted for constituent elements to which applies the description of the constituent elements of the transmitter 100 as listed in the section "Examination and Discovery by the Inventor" above.

In the transmitter 100B in FIG. 20, the component interleaver 140 of the transmitter 100 in FIG. 1 is replaced by a component interleaver 140B. When applying cyclic shifting to the columns of the imaginary-component interleaver matrix, the component interleaver 140B employs a different shift pattern from the above-described conventional shift pattern applied to the columns of the imaginary-component interleaver matrix.

The component interleaver 140B receives a plurality of complex cells of a FEC block (complex cells obtained by initial mapping). The component interleaver 140B writes each real component and imaginary component of the complex cells column by column into a real-component interleaver matrix and an imaginary-component interleaver matrix each having the same structure and $N_R$ rows. $N_R$ is a multiple of $N_{RF}$ larger than $N_{RF}$. Specifically, $N_R = N_{RF} * N_C$.

Next, the component interleaver 140B sequentially uses integers constituting a predetermined shift pattern and repeats the predetermined shift pattern in order to apply a cyclic shift of an integer amount for each column of the imaginary-component interleaver matrix.

The component interleaver 140B then reads out the real components and imaginary components row by row from the real-component interleaver matrix and the imaginary-component interleaver matrix, forming complex cells from the read out real components and imaginary components and outputting the complex cells to subsequent processing blocks. The real component and imaginary component of a complex cell are the real component and imaginary component in the same row and the same column after cyclic shifting. As a result, an FEC block is divided into $N_R$ (=$N_{RF} * N_C$) slices of the same size.

The shift pattern that the component interleaver 140B uses for cyclic shifting of the columns of the imaginary-component interleaver matrix comprises integers other than multiples of $N_{RF}$ (i.e. multiples of $N_{RF}$ are not included). Note that the number of integers in the shift pattern may be either one or greater than one.

An example of this sort of shift pattern is illustrated below.

Full Shift Pattern

As the shift pattern for cyclic shifting, the component interleaver 140B uses a shift pattern yielded by removing shifts that are multiples of $N_{RF}$ from the shift pattern used by the component interleaver 140 (1, 2, . . . , $N_R$−1). In other words, shifts that are multiples of $N_{RF}$ are skipped.

As an example of a full shift pattern used by the component interleaver 140B, the following describes the case in which the number of RF channels $N_{RF}$ is three, and the number of TFS cycles $N_C$ is two.

The full shift pattern used for cyclic shifting by the component interleaver 140B is (1, 2, 4, 5), which is yielded by removing "3", a multiple of $N_{RF}$=3, from the conventional shift pattern of (1, 2, 3, 4, 5).

FIG. 21 illustrates the result of applying cyclic shifts using the full shift pattern (1, 2, 4, 5). FIG. 21 and subsequent FIG. 22 list information showing the TFS cycle and the RF channel to which the real component and the imaginary component of each complex cell are allocated as a result of initial mapping.

The mapping of the components of the constellation block to the RF channels is optimal in the sense that the real component and the imaginary component of each constellation block are mapped to two different RF channels.

Short Shift Patterns A

From the perspective of the temporal separation between components of the constellation, the full shift pattern can be improved. Since the complex cells of a FEC block are transmitted monotonically in time, the temporal separation is maximized when the distance between components of the constellation block is maximized within a FEC block. For 2D rotated constellation blocks, this means that the distance between the two components of each 2D constellation block is half the number of cells in a FEC block.

In the case of only one TFS cycle, the conventional component interleaver 140 cannot be modified to improve the temporal separation. This is because doing so would impair the optimal mapping of the components of the constellation blocks onto the RF channels, which is more important than the maximum temporal separation.

In the case of multiple TFS cycles, the inventor has realized that the temporal separation can be improved without affecting the optimality of the mapping of components of the constellation blocks to the RF channels.

Temporal separation is improved by reducing the number of elements in the above full shift pattern. At the same time, it is possible to guarantee optimal mapping of components of the constellation blocks to the RF channels even when reducing the number of elements in the full shift pattern. The latter can be guaranteed by short shift patterns A of $N_{RF}$−1 integers such that the set of remainders upon dividing each of the $N_{RF}$−1 integers by $N_{RF}$ contains all of the integers 1, 2, . . . , $N_{RF}$−1.

The component interleaver 140B uses these short shift patterns A as the shift pattern for cyclic shifting.

As an example of the short shift patterns A used by the component interleaver 140B, the following describes the case in which the number of RF channels $N_{RF}$ is three, and the number of TFS cycles $N_C$ is two.

The full shift pattern contains (1, 2, 4, 5), whereas the short shift patterns A only contain $N_{RF}-1=2$ of these shifts. Short shift patterns A that guarantee optimal mapping to the RF channels are (1, 2), (2, 4), (4, 5), and (1, 5), since the set of remainders when dividing each of these ($N_{RF}-1$)=2 integers by $N_{RF}$=3 is 1, 2. Indeed, dividing each of the two integer values in these shift patterns by $N_{RF}$=3 yields the remainders (1, 2), (2, 1), (1, 2), and (1, 2).

Short Shift Patterns B

In order to ensure a component separation of a constellation block that is as close as possible to the ideal value of half a FEC block, the $N_{RF}-1$ integers need to be carefully selected from the full shift pattern. For example, the selected $N_{RF}-1$ integers have an arithmetic mean that is preferably as close as possible to $N_R/2$, where $N_R$ is the number of rows in the real-component interleaver matrix and the imaginary-component interleaver matrix. Note that $N_R/2$ is fractional (not an integer) if $N_R$ is odd. In other words, the selected shift pattern is concentrated around an average of $N_R/2$, i.e., has the least possible standard deviation.

Among these short shift patterns A, the component interleaver 140B uses short shift patterns B including $N_{RF}-1$ integers with an average value of $N_R/2$ as the shift pattern for cyclic shifting.

As an example of the short shift patterns B used by the component interleaver 140B, the following describes the case in which the number of RF channels $N_{RF}$ is three, and the number of TFS cycles $N_C$ is two, i.e. the case when $N_R$=6.

The short shift patterns B are (2, 4) and (1, 5). The average is exactly $N_R/2$=3. FIG. 22 illustrates the result of applying cyclic shifts using the short shift pattern B (2, 4).

In some cases, no short shift pattern B can be obtained for which the average value is exactly $N_R/2$. In such cases, the short shift pattern used by the component interleaver 140B may be the shift pattern with an average value nearest to $N_R/2$ among shift patterns with an average value either higher or lower than $N_R/2$. This happens when the number of RF channels in the number of TFS cycles are both even.

Short Shift Pattern C

When the average value of the shift pattern is not exactly $N_R/2$, the average component separation will not be exactly half a FEC block. If needed, the average component separation can be made exactly half a FEC block by making the average shift pattern exactly $N_R/2$.

This can be achieved by combining two short shift patterns into a short shift pattern C as follows.

The first short shift pattern has a shift pattern length of $N_{RF}-1$ such that the set of remainders upon dividing each of the $N_{RF}-1$ integers by $N_{RF}$ contains all of the integers 1, 2, . . . , $N_{RF}-1$, and such that the average value of the $N_{RF}-1$ integers is less than and nearest to $N_R/2$, or is greater than and nearest to $N_R/2$.

The second short shift pattern contains $N_{RF}-1$ integers yielded by subtracting each of the $N_{RF}-1$ integers in the first short shift pattern from $N_R$.

Attaching the second short shift pattern to the first short shift pattern yields the short shift pattern C.

The component interleaver 140B uses this short shift pattern C as the shift pattern for cyclic shifting.

As an example of the short shift pattern C used by the component interleaver 140B, the following describes the case in which the number of RF channels $N_{RF}$ is four, and the number of TFS cycles $N_C$ is two. In this case, the full shift pattern A is (1, 2, 3, 5, 6, 7), and $N_R/2$=4.

In order for the average of the $N_{RF}-1$=3 integers to be less than and nearest to $N_R/2$=4, the first short shift pattern is (2, 3, 5), with an average value of 3.333. The second short shift pattern is (8-5, 8-3, 8-2)=(3, 5, 6), with an average value of 4.666. The short shift pattern C yielded by attaching the second short shift pattern to the first short shift pattern is (2, 3, 5, 3, 5, 6), with average value of exactly $N_R/2$=4.

FIG. 23 illustrates the result of applying cyclic shifts using the short shift pattern C (2, 3, 5, 3, 5, 6). FIG. 23 only shows the imaginary-component interleaver matrix.

The order of the integers in the shift pattern is not important. For example, the above combined shift pattern may be (2, 3, 3, 5, 5, 6).

In order to clearly illustrate the full shift pattern and the short shift patterns B and C, Tables 1, 2, 3, and 4 illustrate the full shift pattern and the short shift patterns B and C when the number of RF channels $N_{RF}$ is two, three, four, and five. Each of the Tables 1, 2, 3, and 4 show the full shift pattern and the short shift patterns B and C for when the number of TFS cycles $N_C$ is between two and five. A short shift pattern C having a shift pattern length of 2*($N_{RF}-1$) is indicated by a star.

TABLE 1

Shift patterns for 2 RF channels

| TFS cycles | Full pattern | Shortened pattern |
|---|---|---|
| 2 | (1, 3) | (1, 3) * |
| 3 | (1, 3, 5) | (3) |
| 4 | (1, 3, 5, 7) | (3, 5) * |
| 5 | (1, 3, 5, 7, 9) | (5) |

TABLE 2

Shift patterns for 3 RF channels

| TFS cycles | Full pattern | Shortened pattern |
|---|---|---|
| 2 | (1, 2, 4, 5) | (2, 4) |
| 3 | (1, 2, 4, 5, 7, 8) | (4, 5) |
| 4 | (1, 2, 4, 5, 7, 8, 10, 11) | (5, 7) |
| 5 | (1, 2, 4, 5, 7, 8, 10, 11, 13, 14) | (7, 8) |

TABLE 3

Shift patterns for 4 RF channels

| TFS cycles | Full pattern | Shortened pattern |
|---|---|---|
| 2 | (1, 2, 3, 5, 6, 7) | (2, 3, 5, 3, 5, 7) * |
| 3 | (1, 2, 3, 5, 6, 7, 9, 10, 11) | (5, 6, 7) |
| 4 | (1, 2, 3, 5, 6, 7, 9, 10, 11, 13, 14, 15) | (6, 7, 9, 7, 9, 10) * |
| 5 | (1, 2, 3, 5, 6, 7, 9, 10, 11, 13, 14, 15, 17, 18, 19) | (9, 10, 11) |

TABLE 4

Shift patterns for 5 RF channels

| TFS cycles | Full pattern | Shortened pattern |
|---|---|---|
| 2 | (1, 2, 3, 4, 6, 7, 8, 9) | (3, 4, 6, 7) |
| 3 | (1, 2, 3, 4, 6, 7, 8, 9, 11, 12, 13, 14) | (6, 7, 8, 9) |
| 4 | (1, 2, 3, 4, 6, 7, 8, 9, 11, 12, 13, 14, 16, 17, 18, 19) | (8, 9, 11, 12) |
| 5 | (1, 2, 3, 4, 6, 7, 8, 9, 11, 12, 13, 14, 16, 17, 18, 19, 21, 22, 23, 24) | (11, 12, 13, 14) |

Other Shift Patterns

The component interleaver 140B may use, as the shift pattern for cyclic shifting, a shift pattern 1 containing a plurality of integers such that the set of remainders upon dividing each of the integers by $N_{RF}$ contains at least two of the integers $1, 2, \ldots, N_{RF}-1$.

Alternatively, the component interleaver 140B may use, as the shift pattern for cyclic shifting, a shift pattern 2 containing one or a plurality of integers such that the quotient upon dividing each of the one or the plurality of integers by $N_{RF}$ is 1, and the remainder is not zero. Note that the remainder may be the same in all cases. Furthermore, the set of remainders may include all of the integers $1, 2, \ldots, N_{RF}-1$. In this case, the real components and the imaginary component of a complex cell are mapped to neighboring TFS cycles, except for the case of mapping the real component of the complex cell obtained as a result of the initial mapping to the last TFS cycle.

As an example of the shift pattern 2 used by the component interleaver 140B, the following describes a case in which the number of RF channels $N_{RF}$ is four, and the number of TFS cycles $N_C$ is three.

As the shift pattern 2 for cyclic shifting, the component interleaver 140B uses a shift pattern 2 (5, 6, 7) in which the quotient is 1 and the remainders are 1, 2, and 3. FIG. 24 illustrates the result of applying cyclic shifts using the shift pattern 2 (5, 6, 7). FIG. 24 only shows the imaginary-component interleaver matrix.

Note that the order of the integers in the shift pattern used for cyclic shifting by the above-described component interleaver 140B is not important. The integers may be in any order.

Receiver and Reception Method

Figure 25:
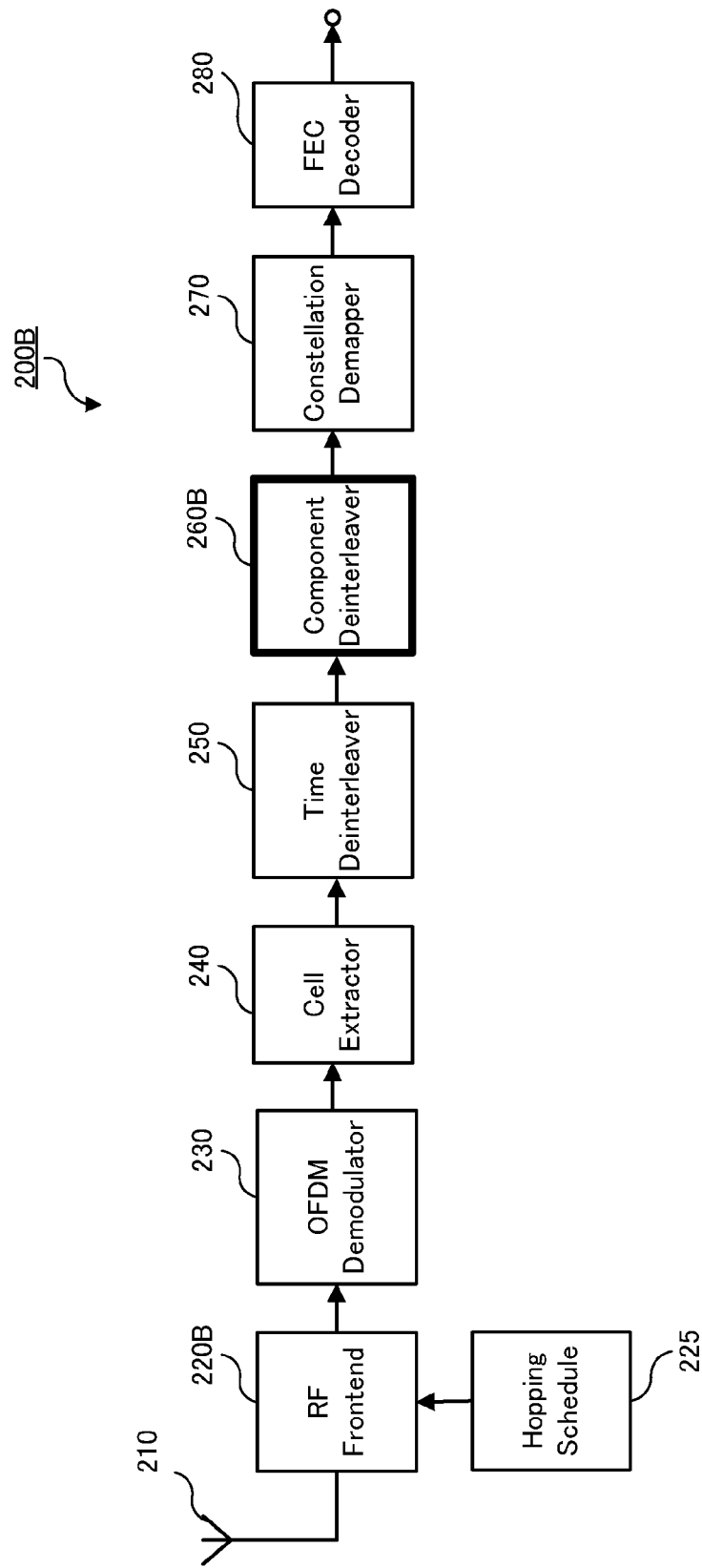
FIG. 25 is a block diagram illustrating the structure of a receiver 200B in Embodiment 2.

FIG. 25 is a block diagram illustrating the structure of a receiver 200B in Embodiment 2 of the present invention. The receiver 200B in FIG. 25 mirrors the functionality of the transmitter 100B in FIG. 20. In the description of reception technology in Embodiment 2, the same reference signs are used and a description is omitted for constituent elements to which applies the description of the constituent elements of the receiver 200A in Embodiment 1.

In the receiver 200B, a hopping scheduling unit 225 is added to the receiver 200A of Embodiment 1, and the RF frontend 220 and component interleaver 260A are replaced with a RF frontend 220B and a component interleaver 260B.

The hopping scheduling unit 225 schedules RF channels received by the RF frontend 220B in accordance with the TFS scheduling information signaled by the transmitter 100B. The RF frontend 220B is controlled by the hopping scheduling unit 225 and hops between the received RF channels. Note that other functions of the RF frontend 220B are substantially the same as the RF frontend 220.

So as to return the real components and the imaginary components of the complex cells in each FEC block to the order before interleaving by the component interleaver 140B of the transmitter, the component deinterleaver 260B deinterleaves the complex cells (component deinterleaving) by applying the opposite permutation from the permutation applied by the component interleaver 140B to the real components and the imaginary components.

Specifically, the component deinterleaver 260B writes each real component and imaginary component of the complex cells row by row into a real-component interleaver matrix and an imaginary-component interleaver matrix each having the same structure and $N_R$ rows. Note that the real-component interleaver matrix and the imaginary-component interleaver matrix used by the component deinterleaver 260B have the same structure as the real-component interleaver matrix and the imaginary-component interleaver matrix used by the component interleaver 140B of the transmitter 100B.

Next, the component deinterleaver 260B sequentially uses integers constituting a predetermined shift pattern and repeats the predetermined shift pattern in order to apply a cyclic shift of an amount obtained by multiplying the integer for each column of the imaginary-component interleaver matrix by (−1). Note that the predetermined shift pattern used by the component deinterleaver 260B is the same as the predetermined shift pattern used by the component interleaver 140B.

The component deinterleaver 260B then reads out the real components and the imaginary components column by column from the real-component interleaver matrix and the imaginary-component interleaver matrix, forming complex cells from the read out real components and imaginary components and outputting the complex cells to subsequent processing blocks. The real component and imaginary component of a complex cell are the real component and imaginary component in the same row and the same column after cyclic shifting.

Supplementary Explanation (Part 1)

The present invention is not limited to the above-described embodiments, but rather may be embodied in a variety of ways, such as those described below, for achieving the aim of the present invention or other aims related or associated thereto. For example, the following modifications are possible.

(1) In Embodiments 1 and 2, an FEC code has been provided as an example of error correction coding, but the transmission technology and reception technology of Embodiments 1 and 2 may be applied to error correction codes other than an FEC code.

(2) In the transmitter of Embodiments 1 and 2, an interleaver that permutes complex QAM symbols may be provided downstream from the QAM mapper, or an interleaver that creates groups of 2*B bits and permutes the groups may be provided upstream from the QAM mapper. In this case, a deinterleaver that creates groups of 2*B soft bits and permutes the groups may be provided downstream of the QAM demapper in the receiver.

(3) In Embodiments 1 and 2, an example using OFDM modulation has been provided, but the transmission technology and reception technology of Embodiments 1 and 2 may be applied to multicarrier modulation or single carrier modulation other than OFDM modulation.

(4) In Embodiments 1 and 2, cyclic shifts are applied to the imaginary-component interleaver matrix, but the cyclic shifts are not limited in this way and may also be applied to the real-component interleaver matrix.

(5) The above embodiments may be implemented using hardware and software. The above embodiments may be implemented or executed with a computing device (processor). The computing device or processor may, for example, be a main processor/general-purpose processor, a digital signal processor (DSP), an application specific integrated circuit (ASIC), a field programmable gate array (FPGA), or other programmable logical device. The above embodiments may be executed or implemented as a combination of these devices.

(6) The above embodiments may be implemented by a combination of software modules that are executed by a processor or directly by hardware. A combination of software modules and hardware implementation is also possible. The software modules may be stored on a variety of computerreadable storage media, such as RAM, EPROM, EEPROM, flash memory, register, hard disk, CD-ROM, DVD, and the like.

Supplementary Explanation (Part 2)

The following summarizes a transmission method, a transmitter, a reception method, and a receiver according to the embodiments, as well as the effects thereof.

A first transmission method is for transmitting digital data over a plurality of $N_{RF}$ frequency channels ($N_{RF}$ being an integer greater than one), the first transmission method comprising the steps of: encoding a block of data of a predetermined length with an error correction code; converting the encoded block of data into a plurality of first complex symbols each including a real component and an imaginary component; with one of the real component and the imaginary component designated as a first component and the other designated as a second component, writing the first components of the first complex symbols column by column into a first interleaver matrix having $N_R$ rows and writing the second components of the first complex symbols column by column into a second interleaver matrix having $N_R$ rows; applying a cyclic shift to each column of the second interleaver matrix in accordance with a predetermined shift pattern; reading the first components from the first interleaver matrix row by row and the second components from the cyclically shifted second interleaver matrix row by row to generate a plurality of second complex symbols; and transmitting the second complex symbols over the frequency channels, each of the second complex symbols corresponding to one of the frequency channels, wherein $N_R$ is a multiple of N RF greater than $N_{RF}$, and the shift pattern for the cyclic shift includes only integers that are not a multiple of $N_{RF}$.

A first transmitter is for transmitting digital data over a plurality of $N_{RF}$ frequency channels ($N_{RF}$ being an integer greater than one), comprising: an encoder configured to encode a block of data of a predetermined length with an error correction code; a converter configured to convert the encoded block of data into a plurality of first complex symbols each including a real component and an imaginary component; a write unit configured, with one of the real component and the imaginary component designated as a first component and the other designated as a second component, to write the first components of the first complex symbols column by column into a first interleaver matrix having $N_R$ rows and to write the second components of the first complex symbols column by column into a second interleaver matrix having $N_R$ rows; a cyclic shift unit configured to apply a cyclic shift to each column of the second interleaver matrix in accordance with a predetermined shift pattern; a read unit configured to read the first components from the first interleaver matrix row by row and the second components from the cyclically shifted second interleaver matrix row by row to generate a plurality of second complex symbols; and a transmission unit configured to transmit the second complex symbols over the frequency channels, each of the second complex symbols corresponding to one of the frequency channels, wherein $N_R$ is a multiple of $N_{RF}$ greater than $N_{RF}$, and the shift pattern for the cyclic shift includes only integers that are not a multiple of $N_{RF}$.

The first transmission method and the first transmitter can transmit the real component and the imaginary component of a first complex symbol over different frequency channels, thereby improving frequency diversity.

A second transmission method is the first transmission method, wherein the converting step includes generating a plurality of real-valued symbols by mapping the encoded block of data to a sequence of real-valued symbols a predetermined number of bits at a time; and generating the first complex symbols by (i) generating a plurality of D-dimensional rotated vectors by multiplying each of a plurality of D-dimensional vectors, each having D of the real-valued symbols as elements, with a D-by-D orthogonal matrix to convert the D-dimensional vector into a D-dimensional rotated vector having D real symbols as elements and (ii) mapping the D real symbols of each of the D-dimensional rotated vectors to D/2 of the first complex symbols, the D/2 first complex symbols being continuous.

The second transmission method provides further robustness against errors by using rotated constellations.

A third transmission method is the first transmission method, wherein the shift pattern for the cyclic shift includes every integer from 1 to $N_R-1$ that is not a multiple of $N_{RF}$.

The third transmission method achieves an appropriate spread over various RF channels of the real components and the imaginary components of the first complex cells.

A fourth transmission method is the first transmission method, wherein the shift pattern includes $N_{RF}-1$ integers, and the $N_{RF}-1$ integers are a combination of integers such that a set of remainders upon dividing each of the $N_{RF}-1$ integers by $N_{RF}$ contains every integer from 1 to $N_{RF}-1$.

The fourth transmission method improves the temporal separation between the real components and the imaginary components of the first complex cells.

A fifth transmission method is the fourth transmission method, wherein an arithmetic average of the $N_{RF}-1$ integers is $N_R/2$.

The fifth transmission method achieves appropriate temporal separation between the real components and the imaginary components of the first complex cells.

A sixth transmission method is the first transmission method, wherein the shift pattern includes $2*(N_{RF}-1)$ integers, $(N_{RF}-1)$ integers among the $2*(N_{RF}-1)$ integers are a first combination of integers such that a set of remainders upon dividing each of the $N_{RF}-1$ integers by $N_{RF}$ contains every integer from 1 to $N_{RF}-1$, and an arithmetic average of the $N_{RF}-1$ integers is less than and nearest to $N_R/2$ or is greater than and nearest to $N_R/2$, and the remaining $(N_{RF}-1)$ integers among the $2*(N_{RF}-1)$ integers are a second combination of integers yielded by subtracting each integer in the first combination of integers from $N_R$.

The sixth transmission method achieves appropriate temporal separation between the real components and the imaginary components of the first complex cells.

A seventh transmission method is the first transmission method, wherein the shift pattern includes two or more integers with different remainders when divided by $N_{RF}$.

The seventh transmission method improves the spread over various RF channels of the real components and the imaginary components of the first complex cells.

An eighth transmission method is the first transmission method, wherein the shift pattern includes one or more integers yielding a quotient of one when divided by $N_{RF}$.

The eighth transmission method achieves appropriate temporal separation between the real components and the imaginary components of the first complex cells.

A first reception method is for receiving digital data over a plurality of $N_{RF}$ frequency channels ($N_{RF}$ being an integer greater than one) by hopping between the frequency channels, the first reception method comprising the steps of: receiving a plurality of first complex symbols each including a real component and an imaginary component; with one of the real component and the imaginary component designated as a first component and the other designated as a second component, writing the first components of the first complex symbols row by row into a first interleaver matrix having $N_R$ rows and writing the second components of the first complex symbols row by row into a second interleaver matrix having $N_R$ rows; applying a cyclic shift to each column of the second interleaver matrix in accordance with a predetermined shift pattern; reading the first components from the first interleaver matrix column by column and the second components from the cyclically shifted second interleaver matrix column by column to generate a plurality of second complex symbols; converting the second complex symbols into an encoded block of data; and decoding the encoded block of data by error correction decoding, wherein $N_R$ is a multiple of $N_{RF}$ greater than $N_{RF}$, and the shift pattern for the cyclic shift includes only integers that are not a multiple of $N_{RF}$.

A first receiver is for receiving digital data over a plurality of $N_{RF}$ frequency channels ($N_{RF}$ being an integer greater than one) by hopping between the frequency channels, comprising: a reception unit configured to receive a plurality of first complex symbols each including a real component and an imaginary component; a write unit configured, with one of the real component and the imaginary component designated as a first component and the other designated as a second component, to write the first components of the first complex symbols row by row into a first interleaver matrix having $N_R$ rows and to write the second components of the first complex symbols row by row into a second interleaver matrix having $N_R$ rows; a cyclic shift unit configured to apply a cyclic shift to each column of the second interleaver matrix in accordance with a predetermined shift pattern; a read unit configured to read the first components from the first interleaver matrix column by column and the second components from the cyclically shifted second interleaver matrix column by column to generate a plurality of second complex symbols; a converter configured to convert the second complex symbols into an encoded block of data; and a decoder configured to decode the encoded block of data by error correction decoding, wherein $N_R$ is a multiple of $N_{RF}$ greater than $N_{RF}$, and the shift pattern for the cyclic shift includes only integers that are not a multiple of $N_{RF}$.

The first reception method and the first receiver achieve excellent frequency diversity.

A ninth transmission method is for transmitting digital data, comprising the steps of: encoding a block of data of a predetermined length with an error correction code; generating a plurality of real-valued symbols by mapping the encoded block of data to a sequence of real-valued symbols a predetermined number of bits at a time; generating first complex symbols each including a real component and an imaginary component by (i) generating a plurality of D-dimensional rotated vectors by multiplying each of a plurality of D-dimensional vectors, each having D of the real-valued symbols as elements, with a D-by-D orthogonal matrix to convert the D-dimensional vector into a D-dimensional rotated vector having D real symbols as elements and (ii) mapping the D real symbols of each of the D-dimensional rotated vectors to D/2 continuous first complex symbols; with one of the real component and the imaginary component designated as a first component and the other designated as a second component, writing the first components of the first complex symbols column by column into a first interleaver matrix having D rows and writing the second components of the first complex symbols column by column into a second interleaver matrix having D rows; applying a cyclic shift of D/2 to each column of the second interleaver matrix; reading the first components from the first interleaver matrix row by row and the second components from the cyclically shifted second interleaver matrix row by row to generate a plurality of second complex symbols; and transmitting the second complex symbols.

A second transmitter is for transmitting digital data, comprising: an encoder configured to encode a block of data of a predetermined length with an error correction code; a real-valued symbol generator configured to generate a plurality of real-valued symbols by mapping the encoded block of data to a sequence of real-valued symbols a predetermined number of bits at a time; a first complex symbol generator configured to generate first complex symbols each including a real component and an imaginary component by (i) generating a plurality of D-dimensional rotated vectors by multiplying each of a plurality of D-dimensional vectors, each having D of the real-valued symbols as elements, with a D-by-D orthogonal matrix to convert the D-dimensional vector into a D-dimensional rotated vector having D real symbols as elements and (ii) mapping the D real symbols of each of the D-dimensional rotated vectors to D/2 continuous first complex symbols; a write unit configured, with one of the real component and the imaginary component designated as a first component and the other designated as a second component, to write the first components of the first complex symbols column by column into a first interleaver matrix having D rows and to write the second components of the first complex symbols column by column into a second interleaver matrix having D rows; a cyclic shift unit configured to apply a cyclic shift of D/2 to each column of the second interleaver matrix; a read unit configured to read the first components from the first interleaver matrix row by row and the second components from the cyclically shifted second interleaver matrix row by row to generate a plurality of second complex symbols; and a transmission unit configured to transmit the second complex symbols.

The ninth transmission method and the second transmitter can spread out D real-valued symbols of a D-dimensional rotated constellation block so as to be even and to have a large minimum distance, thereby achieving excellent time diversity.

A second reception method is for receiving digital data, comprising the steps of: receiving a plurality of complex symbols each including a real component and an imaginary component; with one of the real component and the imaginary component designated as a first component and the other designated as a second component, writing the first components of the first complex symbols row by row into a first interleaver matrix having D rows and writing the second components of the first complex symbols row by row into a second interleaver matrix having D rows; applying a cyclic shift of D/2 to each column of the second interleaver matrix; reading the first components from the first interleaver matrix column by column and the second components from the cyclically shifted second interleaver matrix column by column to generate a plurality of second complex symbols; converting the second complex symbols into an encoded block of data; and decoding the encoded block of data by error correction decoding.

A second receiver is for receiving digital data, comprising: a reception unit configured to receive a plurality of complex symbols each including a real component and an imaginary component; a write unit configured, with one of the real component and the imaginary component designated as a first component and the other designated as a second component, to write the first components of the first complex symbols row by row into a first interleaver matrix having D rows and to write the second components of the first complex symbols row by row into a second interleaver matrix having D rows; a cyclic shift unit configured to apply a cyclic shift of D/2 to each column of the second interleaver matrix; a read unit configured to read the first components from the first interleaver matrix column by column and the second components from the cyclically shifted second interleaver matrix column by column to generate a plurality of second complex symbols; a converter configured to convert the second complex symbols into an encoded block of data; and a decoder configured to decode the encoded block of data by error correction decoding.

The second reception method and the second receiver achieve excellent time diversity.

INDUSTRIAL APPLICABILITY

The present invention can be used in technology and for transmitting and receiving digital data.

REFERENCE SIGNS LIST 100A, 100B transmitter
110 FEC encoder
120 QAM mapper
130 constellation rotation unit
140A, 140B component interleaver
150 time interleaver
160 scheduler
170-1-170-n OFDM modulator
180-1-180-n transmission antenna
200A, 200B receiver
210 reception antenna
220, 220B RF frontend
225 hopping scheduling unit
230 OFDM demodulator
240 cell extraction unit
250 time deinterleaver
260, 260B component deinterleaver
270 constellation demapper
280 FEC decoder

The invention claimed is:

1. A transmission method for transmitting digital data over $N_{RF}$ frequency channels ($N_{RF}$ being an integer greater than one), the transmission method comprising the steps of:
   encoding a block of data of a predetermined length with an error correction code;
   mapping the encoded block of data to a sequence of real-valued symbols a predetermined number of bits at a time;
   generating first complex symbols each including a real component and an imaginary component by (i) generating a plurality of D-dimensional rotated vectors by multiplying each of a plurality of D-dimensional vectors, each having D of the real-valued symbols as elements, with a D-by-D orthogonal matrix to convert the D-dimensional vector into a D-dimensional rotated vector having D real symbols as elements and (ii) mapping the D real symbols of each of the D-dimensional rotated vectors to D/2 consecutive first complex symbols;
   with one of the real component and the imaginary component designated as a first component and the other designated as a second component, writing the first components of the first complex symbols column by column into a first interleaver matrix having $N_R$ rows and writing the second components of the first complex symbols column by column into a second interleaver matrix having $N_R$;
   applying a cyclic shift to each column of the second interleaver matrix in accordance with a predetermined shift pattern;
   reading the first components from the first interleaver matrix row by row and the second components from the cyclically shifted second interleaver matrix row by row to generate a plurality of second complex symbols; and
   transmitting the second complex symbols over the frequency channels by grouping consecutive second complex symbols into $N_R$ slices of equal length with each slice being mapped to one of the $N_{RF}$ channels, wherein
   $N_R$ is a multiple $N_{RF}$ greater than $N_{RF}$, and
   the shift pattern for the cyclic shift includes only integers that are not a multiple of $N_{RF}$.

2. A reception method for receiving digital data over $N_{RF}$ frequency channels ($N_{RF}$ being an integer greater than one) by hopping between the frequency channels, the reception method comprising the steps of:
   receiving a plurality of first complex symbols each including a real component and an imaginary component;
   with one of the real component and the imaginary component designated as a first component and the other designated as a second component, writing the first components of the first complex symbols row by row into a first interleaver matrix having $N_R$ rows and writing the second components of the first complex symbols row by row into a second interleaver matrix having $N_R$ rows;
   applying a cyclic shift to each column of the second interleaver matrix in accordance with a predetermined shift pattern;
   reading the first components from the first interleaver matrix column by column and the second components from the cyclically shifted second interleaver matrix column by column to generate a plurality of second complex symbols;
   converting the second complex symbols into an encoded block of data; and
   decoding the encoded block of data by error correction decoding, wherein
   $N_R$ is a multiple of $N_{RF}$ greater than $N_{RF}$, and
   the shift pattern for the cyclic shift includes only integers that are not a multiple of $N_{RF}$.

3. A transmitter for transmitting digital data over $N_{RF}$ frequency channels ($N_{RF}$ being an integer greater than one), comprising:
   an encoder configured to encode a block of data of a predetermined length with an error correction code;
   a real-valued symbol mapper configured to map the encoded block of data to a sequence of real-valued symbols a predetermined number of bits at a time;
   a first complex symbol generator configured to generate first complex symbols each including a real component and an imaginary component by (i) generating a plurality of D-dimensional rotated vectors by multiplying each of a plurality of D-dimensional vectors, each having D of the real-valued symbols as elements, with a D-by-D orthogonal matrix to convert the D-dimensional vector into a D-dimensional rotated vector having D real symbols as elements and (ii) mapping the D real symbols of each of the D-dimensional rotated vectors to D/2 consecutive first complex symbols;
   a write unit configured, with one of the real component and the imaginary component designated as a first component and the other designated as a second component, to write the first components of the first complex symbols column by column into a first interleaver matrix having $N_R$ rows and to write the second components of the first complex symbols column by column into a second interleaver matrix having $N_R$ rows;

a cyclic shift unit configured to apply a cyclic shift to each column of the second interleaver matrix in accordance with a predetermined shift pattern;

a read unit configured to read the first components from the first interleaver matrix row by row and the second components from the cyclically shifted second interleaver matrix row by row to generate a plurality of second complex symbols; and a transmission unit configured to transmit the second complex symbols over the frequency channels, by grouping consecutive second complex symbols into $N_R$ slices of equal length with each slice being mapped to one of the $N_{RF}$ channels, wherein $N_R$ is a multiple of $N_{RF}$ greater than $N_{RF}$, and the shift pattern for the cyclic shift includes only integers that are not a multiple of $N_{RF}$.

4. A receiver for receiving digital data over $N_{RF}$ frequency channels ($N_{RF}$ being an integer greater than one) by hopping between the frequency channels, comprising:

a reception unit configured to receive a plurality of first complex symbols each including a real component and an imaginary component;

a write unit configured, with one of the real component and the imaginary component designated as a first component and the other designated as a second component, to write the first components of the first complex symbols row by row into a first interleaver matrix having $N_R$ rows and to write the second components of the first complex symbols row by row into a second interleaver matrix having $N_R$ rows;

a cyclic shift unit configured to apply a cyclic shift to each column of the second interleaver matrix in accordance with a predetermined shift pattern;

a read unit configured to read the first components from the first interleaver matrix column by column and the second components from the cyclically shifted second interleaver matrix column by column to generate a plurality of second complex symbols;

a converter configured to convert the second complex symbols into an encoded block of data; and a decoder configured to decode the encoded block of data by error correction decoding, wherein $N_R$ is a multiple of $N_{RF}$ greater than $N_{RF}$, and the shift pattern for the cyclic shift includes only integers that are not a multiple of $N_{RF}$.

5. A transmission method for transmitting digital data, comprising the steps of:

encoding a block of data of a predetermined length with an error correction code;

mapping the encoded block of data to a sequence of real-valued symbols a predetermined number of bits at a time;

generating first complex symbols each including a real component and an imaginary component by (i) generating a plurality of D-dimensional rotated vectors by multiplying each of a plurality of D-dimensional vectors, each having D of the real-valued symbols as elements, with a D-by-D orthogonal matrix to convert the D-dimensional vector into a D-dimensional rotated vector having D real symbols as elements and (ii) mapping the D real symbols of each of the D-dimensional rotated vectors to D/2 consecutive first complex symbols;

with one of the real component and the imaginary component designated as a first component and the other designated as a second component, writing the first components of the first complex symbols column by column into a first interleaver matrix having D rows and writing the second components of the first complex symbols column by column into a second interleaver matrix having D rows;

applying a cyclic shift of D/2 to each column of the second interleaver matrix;

reading the first components from the first interleaver matrix row by row and the second components from the cyclically shifted second interleaver matrix row by row to generate a plurality of second complex symbols; and transmitting the second complex symbols.

* * * * *